United States Patent
Kodama

[11] Patent Number: 5,874,911
[45] Date of Patent: Feb. 23, 1999

[54] ANALOG-TO-DIGITAL CONVERTING CIRCUITRY

[75] Inventor: Shuji Kodama, Tokyo, Japan

[73] Assignee: Mitsubishi Denki Kabushiki Kaisha, Tokyo, Japan

[21] Appl. No.: 946,094

[22] Filed: Oct. 7, 1997

[30] Foreign Application Priority Data

Apr. 10, 1997 [JP] Japan ................................ 9-092154

[51] Int. Cl.$^6$ .................................................. H03M 1/12
[52] U.S. Cl. ............................................................ 341/156
[58] Field of Search ................................ 341/159, 155, 341/156

[56] References Cited

U.S. PATENT DOCUMENTS 5,450,085  9/1995  Stewart et al. .
5,731,776  3/1998  Kumamoto et al. .................... 341/159

FOREIGN PATENT DOCUMENTS 60-211533  10/1985  Japan .
2105629    4/1990   Japan .
4 72919    3/1992   Japan .
6 46010    2/1994   Japan .
8293791    11/1996  Japan .
8293795    11/1996  Japan .
8307271    11/1996  Japan .

*Primary Examiner*—Brian Young
*Attorney, Agent, or Firm*—Leydig, Voit & Mayer

[57] ABSTRACT

Analog-to-digital converting circuitry includes first and second analog-to-digital converting units. A converting start controlling circuit sends out converting start timing signals START1 and START2 which are out of phase with each other. When the first or second analog-to-digital converting unit receives the corresponding converting start timing signal START1 or START2 from the converting start controlling circuit, it samples and holds an analog value of an input signal, and then successively converts the analog value into an n-bit digital signal bit-by-bit and sends out the digital signal. An output selecting circuit outputs the digital signals from the first and second analog-to-digital converting units alternatingly.

6 Claims, 12 Drawing Sheets

ANALOG-TO-DIGITAL CONVERTING CIRCUITRY

BACKGROUND OF THE INVENTION

1. Field of the Invention

The present invention relates to analog-to-digital converting circuitry which can accept an analog signal and produce an n-bit (n is an integer which is greater than or equal to 2) digital signal which represents the analog signal and, more particularly, to successive approximation analog-to-digital converting circuitry for successively analog-to-digital converting the value of an analog input signal being held therein into a digital signal bit-by-bit in synchronization with a clock signal applied thereto.

2. Description of the Prior Art

Improvements have been made in order to speed up the analog-to-digital converting operation of a prior art analog-to-digital converter which can accept an analog signal and produce an n-bit (n is an integer which is greater than or equal to 2) digital signal which represents the analog signal. For example, in Japanese Patent Application Laying Open (KOKAI) No. 60-211533, there is disclosed an Analog-to-digital converter comprising a plurality of sample-and-hold circuits each for sampling and holding an analog input signal, a plurality of Analog-to-digital converting circuits each analog-to-digital converting an output signal from each of the plurality of sample-and-hold circuits, a selecting unit for selecting one from among outputs from the plurality of Analog-to-digital converting circuits to output the selected one, and a control circuit for controlling the operation timing of each of the circuits included in the Analog-to-digital converter. The Analog-to-digital converter starts a sequence of analog-to-digital converting operations in response to a hold instruction at predetermined intervals of T1 which is longer than the length of time T required for a set of a sampling and holding operation, an analog-to-digital converting operation, and an operation of furnishing the binary word which are repeated as a unit. A plurality of sample-and-hold instructions are sequentially delivered to the plurality of sample-and-hold circuits at predetermined intervals of T1/n, respectively. That is, the plurality of sample-and-hold instructions are shifted from each other in time by the length of time T1/n. As a result, the maximum sampling rate becomes (n/T). Thus the analog-to-digital conversion processing can be speeded up.

Japanese Patent Application Laying Open (KOKAI) No. 2-105629 discloses an Analog-to-digital converting apparatus comprising an analog multiplexer for furnishing an analog input signal applied thereto to a plurality of destinations by turns, a plurality of sample-and-hold circuits connected to the analog multiplexer, each for sampling and holding the analog input signal from the analog multiplexer, a plurality of Analog-to-digital converters each for analog-to-digital converting the analog input signal into a digital signal, a digital multiplexer for selecting one from among outputs from the plurality of Analog-to-digital converters and for furnishing the selected one, and a controller for controlling the analog multiplexer, the plurality of sample-and-hold circuits, the plurality of Analog-to-digital converters, and the digital multiplexer. By causing the analog multiplexer to deliver the analog input signal to the plurality of sample-and-hold circuits by turns, the Analog-to-digital converting apparatus disclosed in the reference can sample and hold the analog input signal at predetermined intervals of (1/n) of the minimum Ts of a conversion time period during which each of the plurality of Analog-to-digital converters can perform an Analog-to-digital converting operation, by means of the plurality of sample-and-hold circuits, and then analog-to-digital converts the analog input signal by means of the plurality of Analog-to-digital converters. Thus the Analog-to-digital converting apparatus offers a several-hold or tens-hold improvement in the Analog-to-digital conversion rate in accordance with the number of the plurality of Analog-to-digital converters included in the Analog-to-digital converting apparatus.

Japanese Patent Application Laying Open (KOKAI) No. 4-72919 discloses an analog-to-digital converting apparatus comprising a plurality of Analog-to-digital converters each for converting an analog signal into a digital signal, a sample clock generating unit for generating a plurality of sample clocks which are 180° out of phase with each other and for furnishing the plurality of sample clocks to the plurality of Analog-to-digital converters, respectively, and a switching unit for selecting one from among outputs from the plurality of Analog-to-digital converters by turns and then sequentially furnishing the selected one in synchronization with each of the plurality of sample clocks from the sample clock generating unit. Thus the Analog-to-digital converting apparatus disclosed in the reference can speed up the Analog-to-digital conversion processing by respectively applying the plurality of sample clocks which are out of phase with each other by the same length of time to the plurality of Analog-to-digital converters by means of the sample clock generating unit, and then selecting outputs from the plurality of Analog-to-digital converters by turns and sequentially furnishing the outputs.

Japanese Patent Application Laying Open (KOKAI) No. 6-46010 discloses an analog-to-digital converting apparatus which can analog-to-digital converts an input signal in response to each of eight clock signals which are out of phase with each other. Each of eight Analog-to-digital converters included in the Analog-to-digital converting apparatus can quantize the input signal to an 8-bit digital word in response to each clock generate, so that the eight Analog-to-digital converters sequentially convert values of the input signal applied to the Analog-to-digital converting apparatus via one channel into eight 8-bit digital signals and send out them on eight sets of eight signal lines, respectively. Accordingly, the Analog-to-digital converting apparatus disclosed in the abovementioned reference can speed up the Analog-to-digital conversion processing.

Japanese Patent Application Laying Open (KOKAI) No. 7-162310 (U.S. Pat. No. 5,450,085) discloses a flash-type (i.e., full parallel-type) analog-to-digital converting apparatus comprising a voltage dividing network comprised of a plurality of resistors, for generating a plurality of reference voltages, first and second comparator banks each including a plurality of comparators each having its first input for receiving an analog signal, and its second input for receiving a reference voltage from the voltage dividing network, a comparator activating circuit for activating the comparators of the first comparator bank in response to an even-numbered pulse of a clock signal having two times as long as the periodicity of a system clock, and for activating the comparators of the second comparator bank in response to an odd-numbered pulse of the clock signal, and a digital output selector/encoder for coding outputs from the first and second comparator banks into two digital data, respectively, and then furnishing the two digital data selectively and sequentially. Thus the flash-type analog-to-digital converting apparatus disclosed in the reference can offer a two-fold improvement in the Analog-to-digital conversion rate by alternately activating the first and second comparator banks in response to even-numbered and odd-numbered pulses of the clock signal having two times as long as the periodicity of a system clock. The above-mentioned reference also discloses the use of n comparator banks.

In above-mentioned references such as Japanese Patent Application Laying Open No. 60-211533, No. 2-105629, No. 4-72919, and No. 6-46010, there is no description about the concrete structure of one Analog-to-digital converter included in the Analog-to-digital converting apparatus. However, it is assumed from information described in those references that each Analog-to-digital converter is in the form of a flash-type (i.e., full parallel-type) analog-to-digital converter including a plurality of comparison circuits each for comparing a reference voltage to the value of an analog signal at the same time that the other comparison circuits do, and an encoder for converting the comparison result into a digital signal and then furnishing the digital signal.

While such a prior art analog-to-digital converting apparatus using a plurality of flash-type (or full parallel-type) analog-to-digital converters as disclosed in the above-mentioned references can reduce the time required to convert the value of an analog input signal at a time into a digital signal, it has a disadvantage in that in order to generate an n-bit (n is an integer which is greater than or equal to 2) digital signal, $(2^n-1)$ comparison circuits are needed and therefore the size of the analog-to-digital converting circuitry increases with an increase in the number of bits of the n-bit digital signal to be generated.

SUMMARY OF THE INVENTION

The present invention is made to overcome the problem. It is therefore an object of the present invention to provide successive approximation analog-to-digital converting circuitry, in the form of a flash-type (i.e., full parallel-type) analog-to-digital converter, having a small physical size and being able to generate digital signals that represent values of an analog input signal at a fast rate.

In accordance with the present invention, there is provided analog-to-digital converting circuitry which receives an analog input signal and then converts the analog input signal into an n-bit (n is an integer which is greater than or equal to 2) digital signal, the circuitry comprising: a common reference voltage generating circuit for generating $(2^n-1)$ reference voltages; a plurality of reference voltage selecting circuits each for selecting one from among the plurality of reference voltages generated by the common reference voltage generating circuit according to a corresponding reference voltage selecting signal applied thereto, and for furnishing the selected reference voltage as a comparison voltage; a plurality of bit signal generating circuits each for sampling and holding an value of the analog input signal in response to a corresponding sample-and-hold control signal applied thereto, and for comparing the analog value held to the comparison voltage from a corresponding one of the plurality of reference voltage selecting circuits in response to a corresponding comparison control signal applied thereto and then furnishing a bit signal representing the comparison result in order to determine the value of one bit of an n-bit digital signal that represents the analog value; a plurality of analog-to-digital conversion controlling circuits each for furnishing the sample-and-hold control signal and comparison control signal to a corresponding one of the plurality of bit signal generating circuits in synchronization with a clock signal, for receiving and holding the bit signal from a corresponding one of the plurality of bit signal generating circuits, and for, when determining the value of the most significant bit of the n-bit digital signal, furnishing the reference voltage selecting signal having a predetermined value, and, otherwise, furnishing the reference voltage selecting signal having a value which depends on the values of bit signals already received, to a corresponding one of the plurality of reference voltage selecting circuits in synchronization with the clock signal, each of the plurality of analog-to-digital conversion controlling circuits furnishing all the bit signals as the n-bit digital signal when finishing determining the values of all the bits of the n-bit digital signal; and a control circuit, responsive to a converting start signal from outside the analog-to-digital converting circuitry, for activating the plurality of analog-to-digital conversion controlling circuit by turns and for sending out the n-bit digital signals furnished by the plurality of analog-to-digital conversion controlling circuits by turns.

Preferably, the control circuit includes a converting start controlling circuit, responsive to the converting start signal, for successively generating and furnishing a plurality of converting start timing signals having a periodicity which is longer than that of the converting start signal, and which are out of phase with each other, to the plurality of analog-to-digital conversion controlling circuits, respectively, and for successively generating and furnishing a plurality of select signals having a periodicity which is longer than that of the converting start signal, and which are out of phase with each other; and an output selecting circuit, responsive to each of the plurality of select signals, for selecting the digital signal furnished by a corresponding one of the plurality of analog-to-digital conversion controlling circuits and then furnishing the selected digital signal as an output signal.

If the number of the plurality of analog-to-digital conversion controlling circuits is m which is greater than or equal to 2, the periodicity of the plurality of converting start timing signals can be (1/m) of the periodicity of the converting start signal, and the plurality of converting start timing signals can be $(360/m)°$ out of phase with each other.

In accordance with a preferred embodiment of the present invention, the analog-to-digital converting circuitry comprises a first reference voltage selecting circuit for selecting one from among the plurality of reference voltages generated by the common reference voltage generating circuit according to a first reference voltage selecting signal applied thereto, and for furnishing the selected reference voltage as a comparison voltage; a first bit signal generating circuit for sampling and holding an value of the analog input signal in response to a first sample-and-hold control signal applied thereto, and for comparing the analog value held to the comparison voltage from the first reference voltage selecting circuit in response to a first comparison control signal applied thereto and then furnishing a bit signal representing the comparison result in order to determine the value of one bit of an n-bit digital signal that represents the analog value; a first analog-to-digital conversion controlling circuit for furnishing the first sample-and-hold control signal and first comparison control signal to the first bit signal generating circuit in synchronization with a clock signal, for receiving and holding the bit signal from the first bit signal generating circuit, and for, when determining the value of the most significant bit of the n-bit digital signal, furnishing the first reference voltage selecting signal having a predetermined value, and, otherwise, furnishing the first reference voltage selecting signal having a value which depends on the values of bit signals already received, to the first reference voltage selecting circuit in synchronization with the clock signal, the first analog-to-digital conversion controlling circuit furnishing all the bit signals as the n-bit digital signal when finishing determining the values of all the bits of the n-bit digital signal; a second reference voltage selecting circuit for selecting one from among the plurality of reference voltages generated by the common reference voltage generating circuit according to a second reference voltage selecting signal applied thereto, and for furnishing the selected reference voltage as a comparison voltage; a second bit signal generating circuit for sampling and holding an value of the analog input signal in response to a second sample-and-hold control signal applied thereto, and for comparing the analog value held to the comparison voltage from the second reference voltage selecting circuit in response to a second comparison control signal applied thereto and then furnishing a bit signal representing the comparison result in order to determine the value of one bit of an n-bit digital signal that represents the analog value; a second analog-to-digital conversion controlling circuit for furnishing the second sample-and-hold control signal and second comparison control signal to the second bit signal generating circuit in synchronization with the clock signal, for receiving and holding the bit signal from the second bit signal generating circuit, and for, when determining the value of the most significant bit of the n-bit digital signal, furnishing the second reference voltage selecting signal having a predetermined value, and, otherwise, furnishing the second reference voltage selecting signal having a value which depends on the values of bit signals already received, to the second reference voltage selecting circuit in synchronization with the clock signal, the second analog-to-digital conversion controlling circuit furnishing all the bit signals as the n-bit digital signal when finishing determining the values of all the bits of the n-bit digital signal; a converting start controlling circuit, responsive to the converting start signal, for generating and furnishing first and second converting start timing signals having a periodicity which is longer than that of the converting start signal, and which are out of phase with each other, to the first and second analog-to-digital conversion controlling circuits, successively and respectively, and for successively generating and furnishing first and second select signals having a periodicity which is longer than that of the converting start signal, and which are out of phase with each other; and an output selecting circuit, responsive to each of the first and second select signals, for selecting the digital signal furnished by a corresponding one of the first and second analog-to-digital conversion controlling circuit, and then furnishing the selected digital signal as an output signal.

Further objects and advantages of the present invention will be apparent from the following description of the preferred embodiments of the invention as illustrated in the accompanying drawings.

DETAILED DESCRIPTION OF THE PREFERRED EMBODIMENTS

First Embodiment

Figure 1:
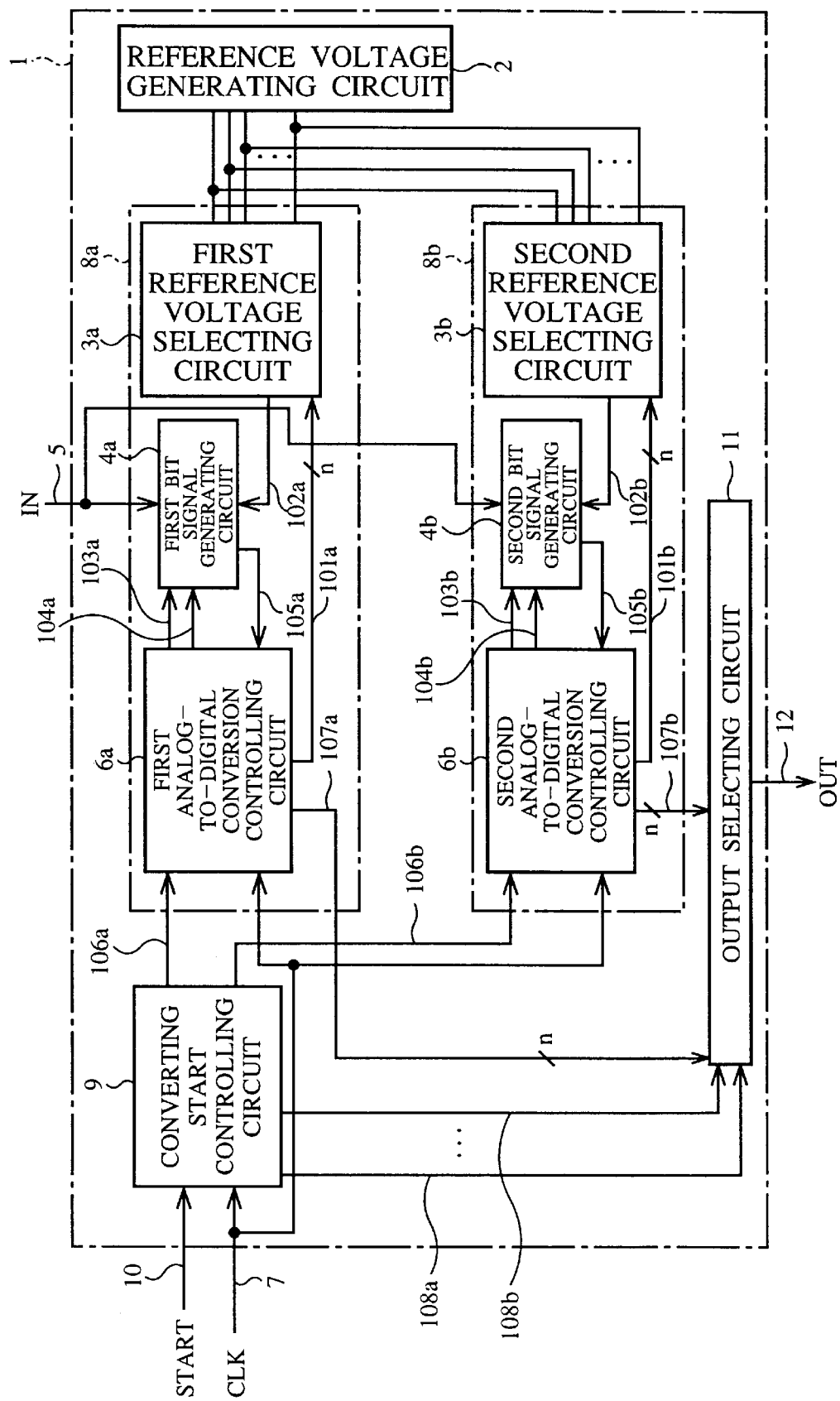
FIG. 1 is a block diagram of analog-to-digital converting circuitry according to a first embodiment of the present invention.

Referring now to FIG. 1, there is illustrated a block diagram of analog-to-digital converting circuitry according to a first embodiment of the present invention, which can be incorporated in a semiconductor integrated circuit. In the figure, reference numeral 2 denotes a common reference voltage generating circuit for generating ($2^n-1$) (n is an integer which is greater than or equal to 2, e.g., 8) reference voltages, and 3a denotes a first reference voltage selecting circuit comprised of a selector for selecting one reference voltage from among the ($2^n-1$) reference voltages generated by the common reference voltage generating circuit 2 according to a first n-bit reference voltage selecting signal applied thereto via a signal bus 101a constructed of n signal lines, and for sending out the selected reference voltage as a comparison voltage on a signal line 102a.

Furthermore, reference numeral 4a denotes a first bit signal generating circuit which samples and holds the value of an analog input signal applied thereto via an input signal line 5 in response to a first sample-and-hold control signal applied thereto via a signal line 103a, and which then compares the value of the analog input signal being held to the comparison voltage from the first reference voltage selecting circuit 3a applied thereto via the signal line 102a and then sends out one bit signal representing the comparison result, which is included in an n-bit digital signal into which the analog input signal is converted, on a signal line 105a.

Figure 2:
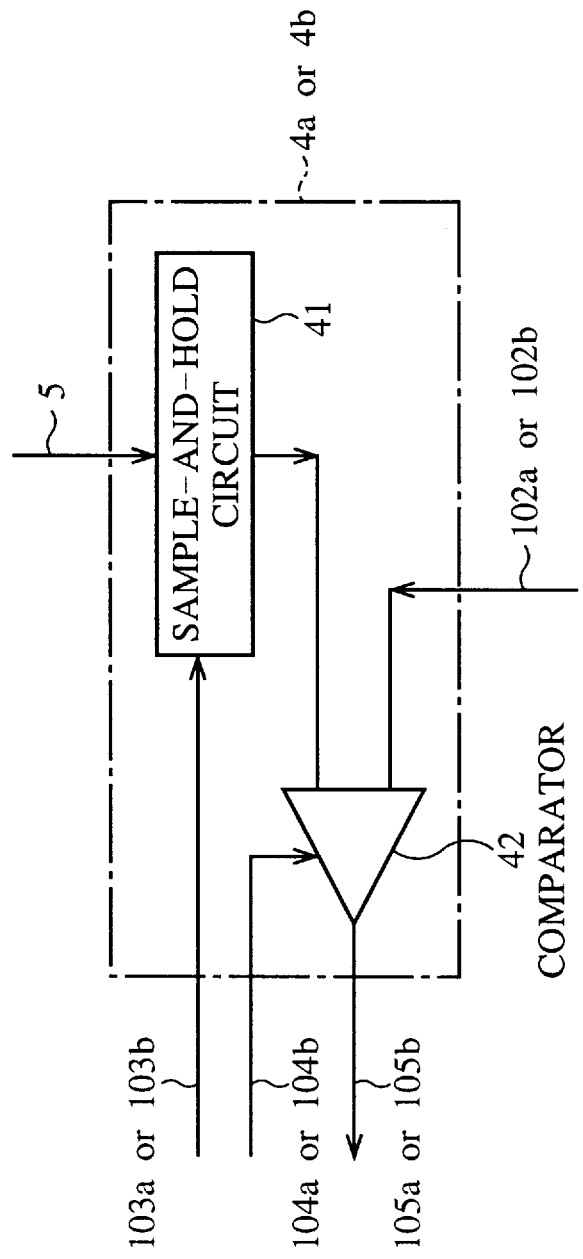
FIG. 2 is a block diagram showing the structure of a bit signal generating circuit of the analog-to-digital converting circuitry shown in FIG. 1.

Referring next to FIG. 2, there is illustrated a block diagram showing the structure of the first bit signal generating circuit 4a. In the figure, reference numeral 41 denotes a sample-and-hold circuit for sampling and holding the value of an analog input signal applied thereto via the input signal line 5 in response to the first sample-and-hold control signal applied thereto via the signal line 103a. The sample-and-hold circuit 41 of this embodiment is activated when the first sample-and-hold control signal makes a LOW to HIGH transition. While the first sample-and-hold control signal is held at a logic HIGH level, the sample-and-hold circuit 41 samples the value of the analog input signal. When the first sample-and-hold control signal then makes a HIGH to LOW transition, the sample-and-hold circuit finishes the sampling. Furthermore, reference numeral 42 denotes a comparator, responsive to the first comparison control signal applied thereto via the signal line 104a, for comparing the value of the analog input signal being held by the sample-and-hold circuit 41 to the comparison voltage from the first reference voltage selecting circuit 3a applied thereto via the signal line 102a, and for sending out one bit signal representing the comparison result, which is included in the n-bit digital signal into which the analog input signal is converted, on the signal line 105a. The first bit signal generating circuit 4 is comprised of the comparator 42 and the sample-and-hold circuit 41. When the first comparison control signal makes a LOW to HIGH transition, the comparator 42 of this embodiment compares the analog value from the sample-and-hold circuit 41 applied thereto to the comparison voltage from the first reference voltage selecting circuit 3a. As a result, the comparator furnishes a bit signal at a logic HIGH level when the analog value is greater than the value of the comparison voltage, and furnishes a bit signal at a logic LOW level when the analog value is lower than or equal to the value of the comparison voltage.

In FIG. 1, reference numeral 6a denotes a first analog-to-digital conversion controlling circuit, responsive to a first conversion start timing signal START1 applied thereto via a signal line 106a, for furnishing the first sample-and-hold control signal to the sample-and-hold circuit 41 of the first bit signal generating circuit 4a by way of the signal line 103a in synchronization with a clock signal CLK applied thereto via a clock input signal line 7, and for furnishing the first comparison control signal to the comparator 42 of the first bit signal generating circuit 4a by way of the signal line 104a. When the first analog-to-digital conversion controlling circuit 6a receives bit signal from the comparator 42, which represents a comparison result obtained by the comparator 42 of the first bit signal generating circuit 4a, by way of the signal line 105a, the first analog-to-digital conversion controlling circuit 6a furnishes the first n-bit reference voltage selecting signal which is synchronized with the clock signal CLK to the first reference voltage selecting circuit 3a by way of the signal bus 101a. Furthermore, the first analog-to-digital conversion controlling circuit 6a temporarily holds the bit signal from the comparator 42 of the first bit signal generating circuit 4a in synchronization with the clock signal CLK, and then sends out the bit signal as a part of the n-bit digital signal on the signal bus 107a constructed of n signal lines after all the bit signals which construct the n-bit digital signal are delivered to the analog-to-digital conversion controlling circuit 6a.

Figure 3:
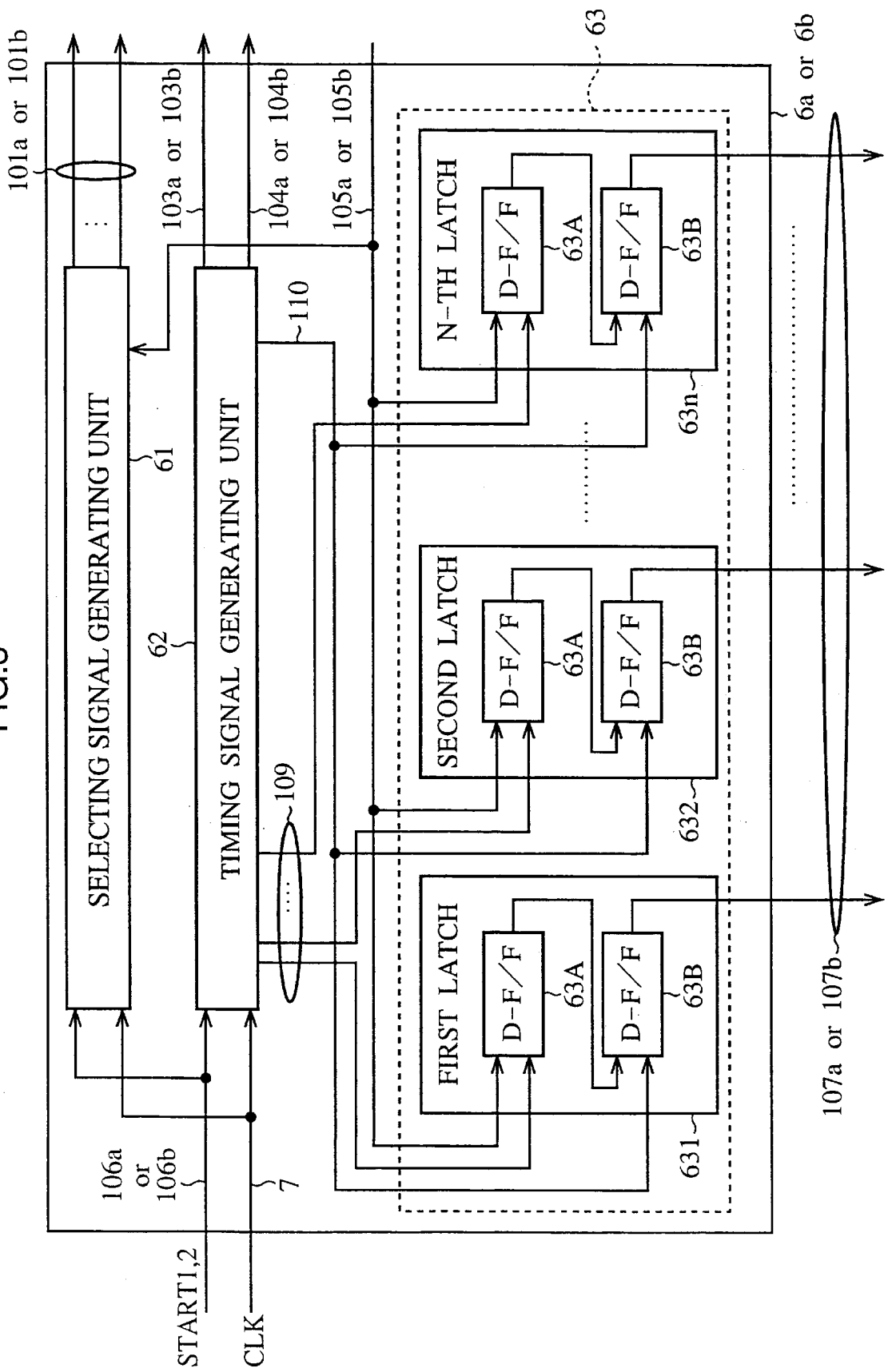
FIG. 3 is a block diagram showing the structure of an analog-to-digital conversion controlling circuit of the analog-to-digital converting circuitry shown in FIG. 1.

Referring next to FIG. 3, there is illustrated a block diagram showing the structure of the analog-to-digital conversion controlling circuit 6a. In the figure, reference numeral 61 denotes a selecting signal generating unit which receives the bit signal representing the comparison result obtained by the comparator 42 of the first bit signal generating circuit 4a via the signal line 105a, and which, in response to the first conversion start timing signal START1 applied thereto via the signal line 106a, generates the first n-bit reference voltage selecting signal from the bit signal and other bit signals already received, and then furnishes the first n-bit reference voltage selecting signal to the first reference voltage selecting circuit 3a by way of the signal bus 101a in synchronization with the clock signal CLK applied thereto via the clock input signal line 7.

The selecting signal generating unit 61 generates the first n-bit reference voltage selecting signal in the following manner. During a sample-and-hold period of time, all the n bits of the first reference voltage selecting signal are at a logic LOW level. Within a bit-by-bit conversion period of time during which conversion (i.e., comparison) is carried out for each bit of the n-bit digital signal to be generated, the value of the first n-bit reference voltage selecting signal is varied according to the value of each bit signal furnished by the first bit signal generating circuit 4a. That is, when the bit-by-bit conversion is started following the completion of the sample-and-hold time period, only the most significant bit signal among the first n-bit reference voltage selecting signal makes a LOW to HIGH transition in synchronization with a rising edge of the clock signal CLK, as indicated by the waveform (a) in FIG. 7 (also indicated by the waveform (b) in FIG. 6), which is a basic clock for the analog-to-digital converting circuit 1, first (see the waveform (e1) in FIG. 7). The most significant bit signal included in the first n-bit reference voltage selecting signal will be referred to as voltage control signal #1 in this specification. All the remaining bit signals are held at a logic LOW level. Thus the first reference voltage selecting signal is comprised of parallel voltage control signals at logic HIGH, logic LOW . . . , and logic LOW levels, as shown in FIG. 7.

The selecting signal generating unit 61 then captures the bit signal which the most significant bit of the n-bit digital signal to be generated from the first bit signal generating circuit 4a in synchronization on the next rising edge of the clock signal CLK. When the bit signal captured is at a logic HIGH level, the selecting signal generating unit 61 holds the voltage control signal #1 at a logic HIGH level. After that, the voltage control signal #1 remains at a logic HIGH level within the bit-by-bit conversion time period for all the bits of the n-bit digital signal. On the contrary, when the bit signal captured is at a logic LOW level, the selecting signal generating unit 61 causes the voltage control signal #1 to make a HIGH to LOW transition. After that, the voltage control signal #1 remains at a logic LOW level within the bit-by-bit conversion time period for all the bits of the n-bit digital signal. Then the second-most significant bit signal, which will be referred to as voltage control signal #2, included in the first n-bit reference voltage selecting signal makes a LOW to HIGH transition at the completion of the bit conversion for the most significant bit of the n-bit digital signal (see the waveform designated by (e2) in FIG. 7). At that time, the remaining bit signals of the first reference voltage selecting signal except the voltage control signal #1 remain at a logic LOW level. The first reference voltage selecting signal is thus comprised of parallel voltage control signals at logic HIGH or LOW, logic HIGH, logic LOW . . . , and logic LOW levels, as shown in FIG. 7.

The selecting signal generating unit 61 then captures the bit signal which corresponds to the second-most significant bit of the n-bit digital signal to be generated from the first bit signal generating circuit 4a in synchronization on the next rising edge of the clock signal CLK. When the bit signal captured is at a logic HIGH level, the selecting signal generating unit 61 holds the voltage control signal #2 at a logic HIGH level. After that, the voltage control signal #2 remains at a logic HIGH level within the bit-by-bit conversion time period for all the remaining bits of the n-bit digital signal. On the contrary, when the bit signal captured is at a logic LOW level, the selecting signal generating unit 61 causes the voltage control signal #2 to make a HIGH to LOW transition. After that, the voltage control signal #2 remains at a logic LOW level within the bit-by-bit conversion time period for all the remaining bits of the n-bit digital signal. Then the third-most significant bit signal, which will be referred to as voltage control signal #3, included in the first n-bit reference voltage selecting signal makes a LOW to HIGH transition at the completion of the bit conversion for the second-most significant bit of the n-bit digital signal to be generated (see the waveform designated by (e3) in FIG. 7). At that time, the remaining bit signals of the first reference voltage selecting signal except the voltage control signals #1 and #2 remain at a logic LOW level. Thus the first reference voltage selecting signal is comprised of parallel voltage control signals at logic HIGH or LOW, logic HIGH or LOW, logic HIGH, logic LOW, . . . , and logic LOW levels, as shown in FIG. 7.

Thus the first reference voltage selecting signal can be varied in synchronization with a rising edge of the clock signal CLK during the bit-by-bit conversion period of time. Finally, parallel voltage control signals at logic HIGH or LOW, . . . , logic HIGH or LOW, and logic HIGH levels are delivered as the first reference voltage selecting signal in synchronization with the rising edge of the nth pulse of the clock signal CLK applied during the bit-by-bit conversion time period. After that, the next sample-and-hold time period is started on the next rising edge of the clock signal CLK, and the selecting signal generating unit 61 causes all the voltage control signals #1 through #n to make a transition to a logic LOW level. After that, the AD converting circuitry of this embodiment repeats the sample-and-hold and conversion operation mentioned above on another value of the analog input signal similarly. The length of time required to capture a value of an analog input signal, convert the analog value into a digital signal, and then furnish the digital signal is the sum of the sample-and-hold time period and the bit-by-bit conversion time period.

In FIG. 3, reference numeral 62 denotes a timing signal generating unit which, in response to the first conversion start timing signal START1 applied thereto via the signal line 106a, sends out the first sample-and-hold control signal on the signal line 103a and the first comparison control signal on the signal line 104a in synchronization with the clock signal CLK applied thereto via the clock input signal line 7, and which sends out a first latch control signal on the signal bus 109 constructed of n signal lines and a second latch signal on the signal line 110.

After the first conversion start timing signal START1 makes a LOW to HIGH transition, the timing signal generating unit 62 causes the first sample-and-hold control signal to make a LOW to HIGH transition on a rising edge of the clock signal CLK. After that, when predetermined periods (e.g., 2 periods as shown in FIG. 7) of the clock signal CLK are applied to the timing signal generating unit 62, the timing signal generating unit 62 causes the first sample-and-hold control signal to make a HIGH to LOW transition (see the waveform designated by (c) in FIG. 7). The period of time during which the first sample-and-hold control signal is held at a logic HIGH level is the sample-and-hold time period.

The first comparison control signal furnished by the timing signal generating unit 62 remains at a logic LOW level during the sample-and-hold time period. After the completion of the sample-and-hold time period, the timing signal generating unit 62 causes the first comparison control signal to make a LOW to HIGH transition in synchronization with any rising edge of the clock signal CLK during the bit-by-bit conversion period of time (see the waveform designated by (d) in FIG. 7). The first comparison control signal can substitute as the first conversion start timing signal START 1 and the clock signal CLK applied to the selecting signal generating unit 61. In this case, the selecting signal generating unit 61 can use the first comparison control signal just as it is in order to generate the first reference voltage selecting signal in synchronization with the first comparison control signal. This variant can simplify the circuit structure.

The first latch control signal furnished by the timing signal generating unit 62 defines the timing with which the first analog-to-digital conversion controlling circuit 6a captures each bit signal indicating a comparison result from the comparator 42 of the first bit signal generating circuit 4a, which is applied to the first analog-to-digital conversion controlling circuit 6a via the signal line 105a during the bit-by-bit conversion period of time. After the completion of the sample-and-hold time period, the first latch control signal includes n pulses which sequentially make a LOW to HIGH transition in synchronization with the clock signal CLK, and each of which then remains at a logic HIGH level within only one period of the clock signal CLK during the bit-by-bit conversion time period. The n pulses of the first latch control signal are sequentially sent out on the n signal lines of the signal bus 109, respectively.

The second latch control signal furnished by the timing signal generating unit 62 defines the timing to furnish, as the n-bit digital signal, all the bit signals from the first bit signal generating circuit 4a which have been captured and held in the analog-to-digital conversion controlling circuit 6a. The second latch control signal makes a LOW to HIGH transition in synchronization with the last pulse of the clock signal CLK applied thereto, e.g., the falling edge of the last pulse of the clock signal CLK, during the bit-by-bit conversion time period, and then remains at a logic HIGH level within predetermined periods of the clock signal CLK, e.g., only one period of the clock signal CLK.

In FIG. 3, reference numeral 63 denotes a memory unit, responsive to the first latch control signal from the timing signal generating unit 62, for temporarily holding each bit signal applied thereto via the signal line 105a by the comparator 42 of the first bit signal generating circuit 4a in synchronization with the clock signal CLK, and for sending out all the bit signals on the signal bus 107a constructed of n signal lines in response to the second latch control signal from the timing signal generating unit 62. The first analog-to-digital conversion controlling circuit 6a is thus comprised of the memory unit 63, the selector signal generating unit 61, and the timing signal generating unit 62.

The memory unit 63 is provided with first through nth latches 631 through 63n which respectively correspond to n bits of the digital signal into which an analog input signal is converted by the AD converting circuitry of this embodiment. Each of the first through nth latches 631 through 63n includes first and second D type flip-flops 63A and 63B. The first D type flip-flop 63A has its D input terminal connected to the signal line 105a, its Q output terminal connected to the D input terminal of the second D type flip-flop 63B, and its clock input terminal connected to a corresponding signal line of the signal bus 109. The second D type flip-flop 63B has its Q output terminal connected to a corresponding signal line of the signal bus 107a, and its clock terminal connected to the signal line 110.

The first reference voltage selecting circuit 3a, first bit signal generating circuit 4a, and first analog-to-digital conversion controlling circuit 6a construct a first analog-to-digital converting unit 8a.

In FIG. 1, 3b denotes a second reference voltage selecting circuit comprised of a selector for selecting one reference voltage from among the ($2^n$–1) reference voltages generated by the common reference voltage generating circuit 2 according to a second n-bit reference voltage selecting signal applied thereto via a signal bus 101b constructed of n signal lines, and for sending out the selected reference voltage as a comparison voltage on a signal line 102b. Furthermore, reference numeral 4b denotes a second bit signal generating circuit which holds the value of an analog input signal applied thereto via the input signal line 5 in response to a second sample-and-hold control signal applied thereto via a signal line 103b, and which compares the value of the analog input signal being held to the comparison voltage from the second reference voltage selecting circuit 3b applied thereto via the signal line 102b and then sends out one bit signal representing the comparison result included in an n-bit digital signal into which the analog signal is converted on a signal line 105b. The second bit signal generating circuit 4b is provided with the sample-and-hold circuit 41 and the comparator 42, as shown in FIG. 2. Thus, the second bit signal generating circuit 4b has the same structure and functions as the first bit signal generating circuit 4a mentioned above.

Reference numeral 6b denotes a second analog-to-digital conversion controlling circuit, responsive to a second conversion start timing signal START2 applied thereto via a signal line 106b, for furnishing the second sample-and-hold control signal to the sample-and-hold circuit 41 of the second bit signal generating circuit 4b by way of the signal line 103b in synchronization with the clock signal CLK applied thereto via the clock input signal line 7, and for furnishing the second comparison control signal to the comparator 42 of the second bit signal generating circuit 4b by way of the signal line 104b. In synchronization with the clock signal CLK, the second analog-to-digital conversion controlling circuit 6b also holds the value of the bit signal from the comparator 42 representing the comparison result obtained by the comparator 42 of the second bit signal generating circuit 4b temporarily. Furthermore, the second analog-to-digital conversion controlling circuit 6b generates the second n-bit reference voltage selecting signal from the bit signal from the comparator 42 and other bit signals already received, which have been applied thereto via the signal line 105b, in synchronization with the clock signal CLK. The second analog-to-digital conversion controlling circuit 6b then furnishes the second n-bit reference voltage selecting signal synchronized with the clock signal CLK to the second reference voltage selecting circuit 3b by way of the signal bus 101b. Finally, the second analog-to-digital conversion controlling circuit 6b sends out all the bit signals as an n-bit digital signal on the signal bus 107b constructed of n signal lines after all the bit signals which construct the n-bit digital signal are delivered to the analog-to-digital conversion controlling circuit 6b. The second analog-to-digital conversion controlling circuit 6b is provided with the selector signal generating circuit 61, the timing signal generating unit 62, and the memory unit 63, as shown in FIG. 3. Thus, the second analog-to-digital conversion controlling circuit 6b has the same structure and functions as the first analog-to-digital conversion controlling circuit 6a mentioned above.

The second reference voltage selecting circuit 3b, second bit signal generating circuit 4b, and second analog-to-digital conversion controlling circuit 6b construct a second analog-to-digital converting unit 8b.

In FIG. 1, reference numeral 9 denotes a converting start controlling circuit, responsive to a converting start signal START applied thereto via a start signal input line 10, for sending out the first and second converting start timing signals START1 and START2 having two times as long as the periodicity of the converting start signal START and being 180° out of phase with each other on the signal lines 106a and 106b, respectively, and for sending out select signals S1 and S2 having two times as long as the periodicity of the converting start signal START and being 180° out of phase with each other on signal lines 108a and 108b, respectively.

Figure 4:
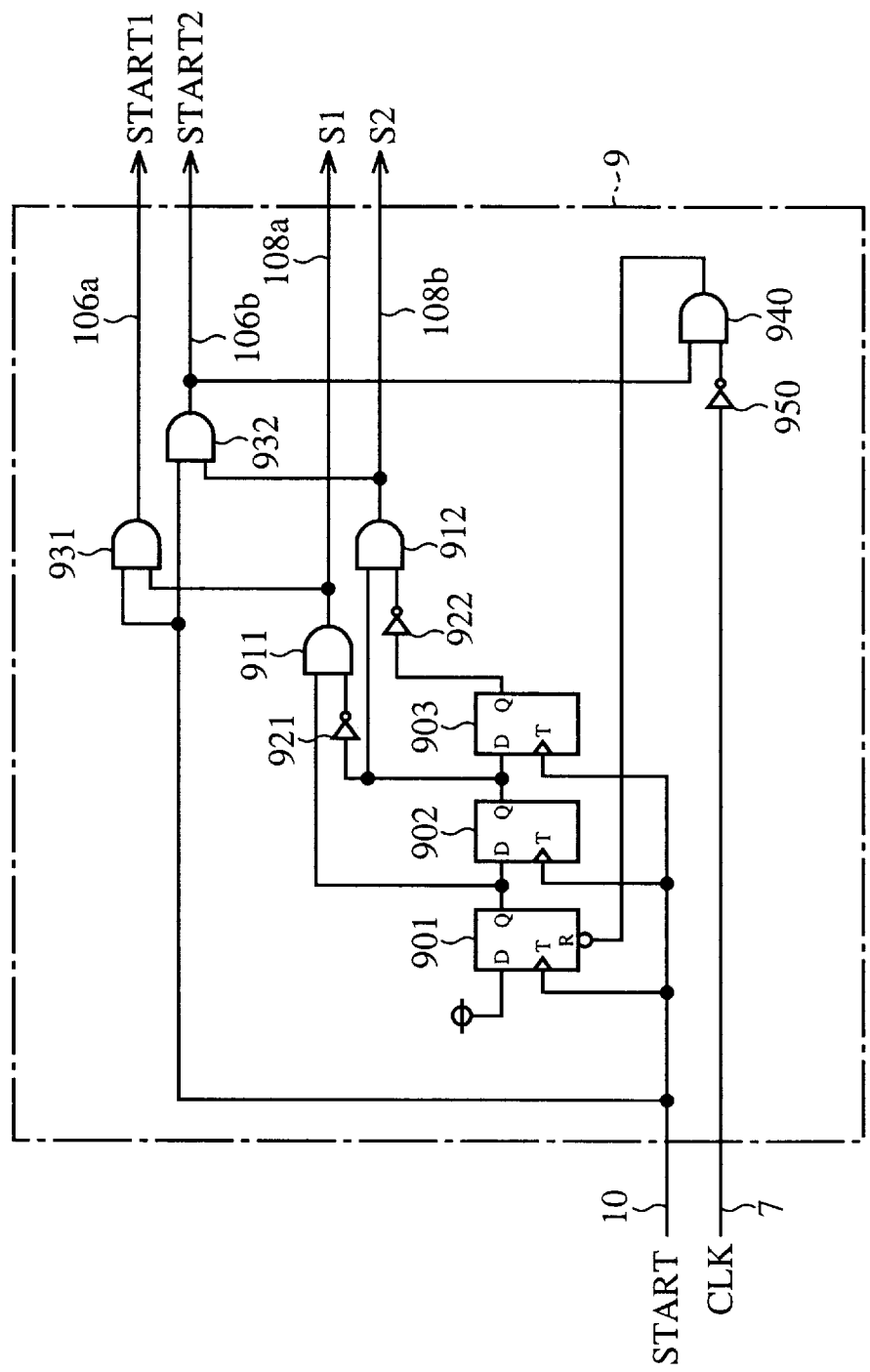
FIG. 4 is a circuit diagram showing the structure of a converting start controlling circuit of the analog-to-digital converting circuitry shown in FIG. 1.

Referring next to FIG. 4, there is illustrated a block diagram showing the structure of the converting start controlling circuit 9. In the figure, reference numerals 901, 902, and 903 each denotes a D type flip-flop included in a cascaded three-stage series of three D type flip-flops. The D type flip-flop 901 at the first stage has its input terminal D connected to a node with a power supply potential, and its clock input terminal T connected to the signal line 10 via which the converting start signal START is applied thereto. The D type flip-flop 902 at the second stage has its input terminal D connected to the output terminal Q of the D type flip-flop 901 at the first stage, and its clock input terminal T connected to the signal line 10 via which the converting start signal START is applied thereto. The D type flip-flop 903 at the third stage has its input terminal D connected to the output terminal Q of the D type flip-flop 902 at the second stage, and its clock input terminal T connected to the signal line 10 via which the converting start signal START is applied thereto.

Reference numeral 911 denotes a first select signal logic circuit comprised of a two-input AND gate having its output terminal connected to the signal line 108a via which the converting start control circuit 9 furnishes the first select signal S1, and 912 denotes a second select signal logic circuit comprised of a two-input AND gate having its output terminal connected to the signal line 108b via which the converting start control circuit 9 furnishes the second select signal S2. The first select signal logic circuit 911 has its first input terminal connected to the output terminal Q of the D type flip-flop 901 at the first stage, and its second input terminal connected to the output terminal Q of the D type flip-flop 902 at the second stage by way of an inverter 921. The second select signal logic circuit 912 has its first input terminal connected to the output terminal Q of the D type flip-flop 902 at the second stage, and its second input terminal connected to the output terminal Q of the D type flip-flop 903 at the third stage by way of an inverter 922.

Reference numeral 931 denotes a first converting start signal logic circuit comprised of a two-input AND gate having its output terminal connected-to the signal line 106a via which the converting start controlling circuit 9 furnishes the first converting start timing signal START1, and 932 denotes a second converting start signal logic circuit comprised of a two-input AND gate having its output terminal connected to the signal line 106b via which the converting start control circuit 9 furnishes the second converting start timing signal START2. The first converting start signal logic circuit 931 has its first input terminal connected to the start signal input line 10, and its second input terminal connected to the output terminal of the first select signal logic circuit 911. The second converting start signal logic circuit 932 has its first input terminal connected to the start signal input line 10, and its second input terminal connected to the output terminal of the second select signal logic circuit 912. Furthermore, reference numeral 940 denotes a reset logic circuit comprised of a two-input AND gate having its first input terminal connected to the output terminal of the second converting start signal logic circuit 932, its second input terminal to which the clock signal CLK is applied by way of an inverter 950, and its output terminal connected to the reset terminal of the D type flip-flop 901 at the first stage.

Figure 6:
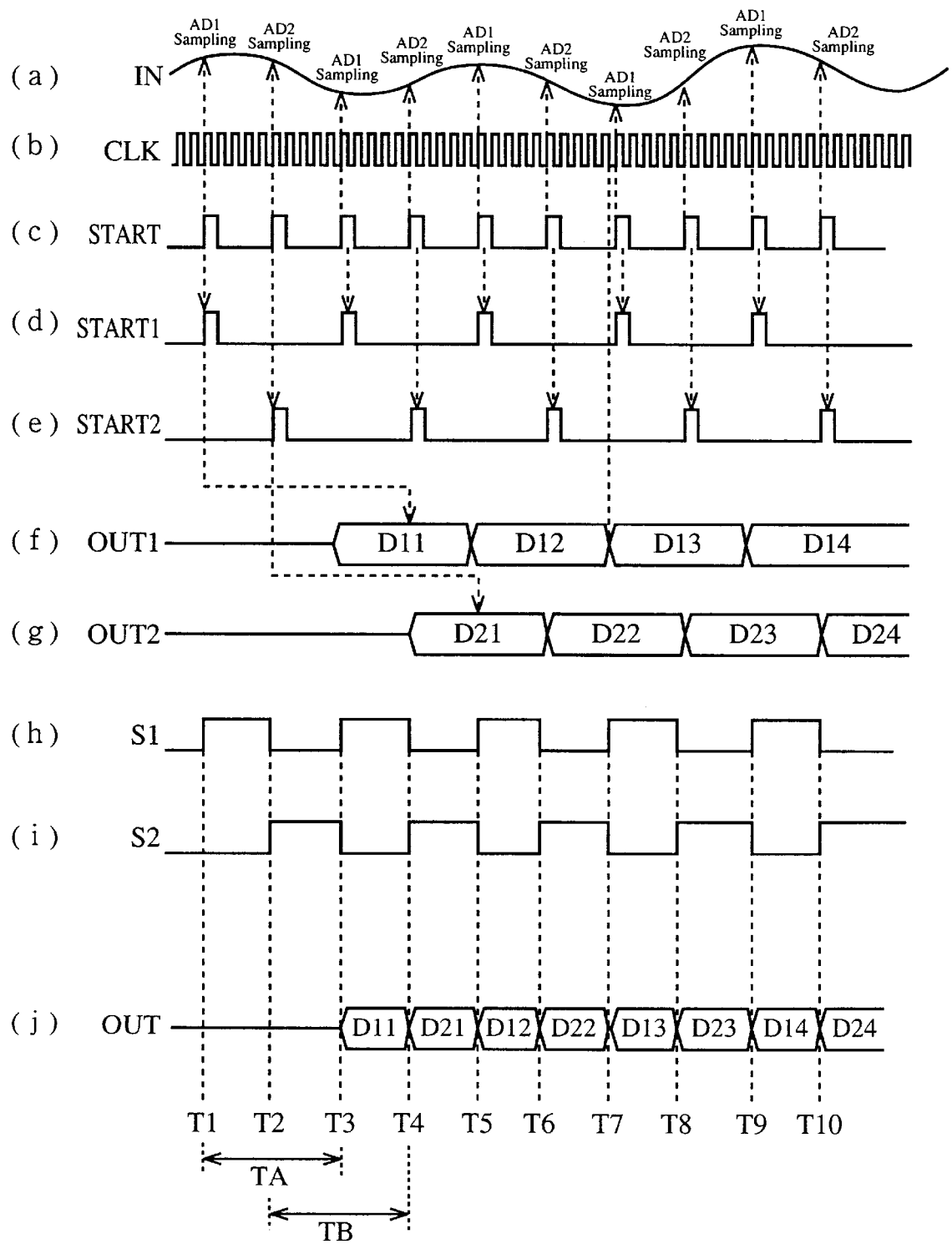
FIG. 6 is a timing diagram showing the operation timing with which the analog-to-digital converting circuitry according to the first embodiment of the present invention performs the analog-to-digital conversion operation.
Figure 7:
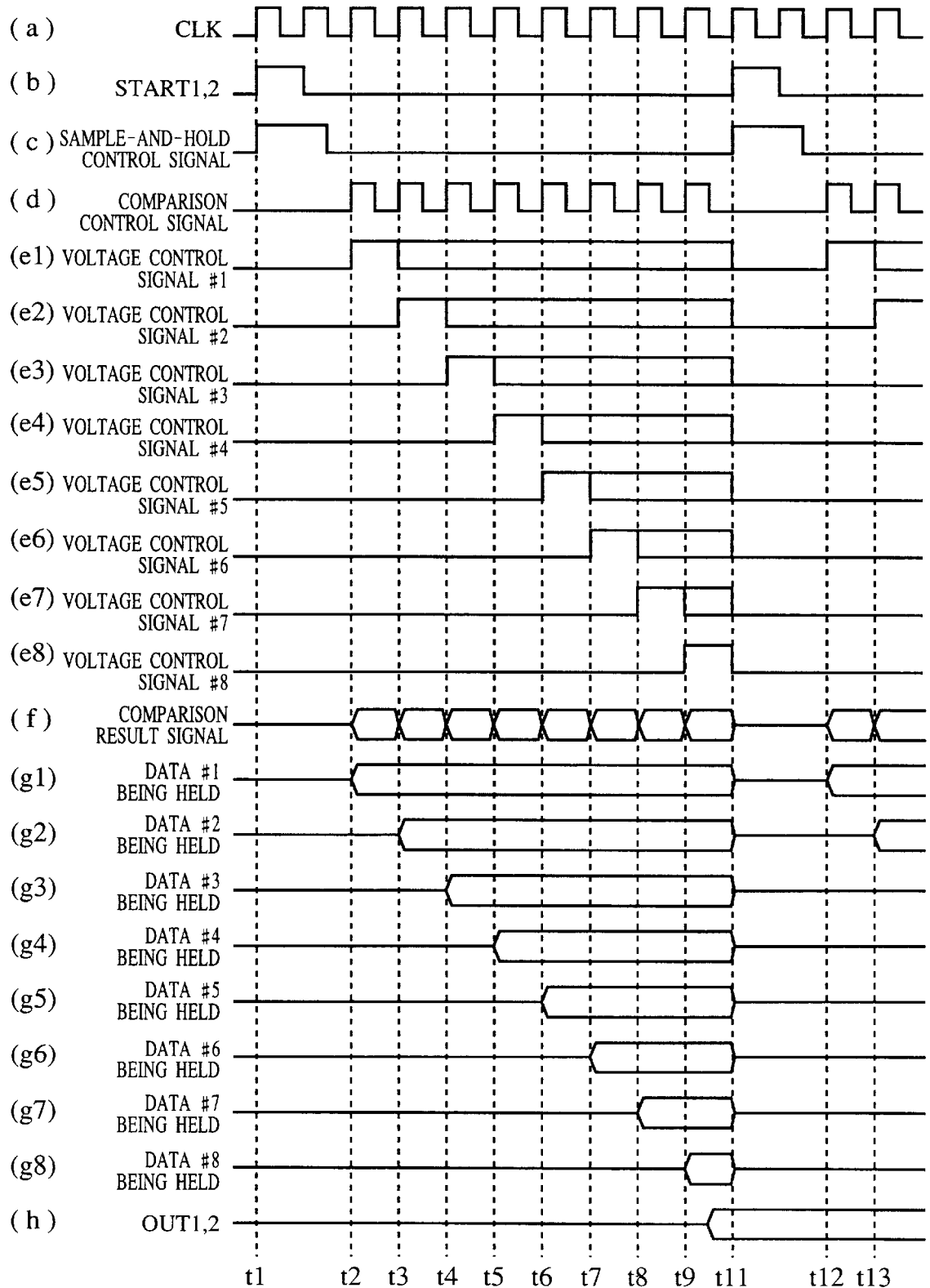
FIG. 7 is a timing diagram showing details of the operation timing with which the analog-to-digital converting circuitry according to the first embodiment of the present invention performs the analog-to-digital conversion operation.

When an odd-numbered pulse of the converting start signal START applied thereto via the start signal input line 10 makes a LOW to HIGH transition, the converting start controlling circuit 9 having the structure as shown in FIG. 4 causes the first converting start timing signal START1 to make a LOW to HIGH transition on a rising edge of the clock signal CLK applied thereto via the clock input line 7, and then sends out the first converting start timing signal START1 on the signal line 106a (see the waveform designated by (d) in FIG. 6). In addition, when an even-numbered pulse of the converting start signal START makes a LOW to HIGH transition, the converting start controlling circuit 9 causes the second converting start timing signal START2 to make a LOW to HIGH transition on a rising edge of the clock signal CLK, and then sends out the second converting start timing signal START2 on the signal line 106b (see the waveform designated by (e) in FIG. 6). Thus the first and second converting start timing signals START1 and START2 have two times as long as the periodicity of the converting start signal START, and they are 180° out of phase with each other.

Furthermore, the converting start controlling circuit 9 causes the first select signal S1 to make a LOW to HIGH transition on a rising edge of the clock signal CLK applied thereto when an odd-numbered pulse of the converting start signal START makes a LOW to HIGH transition, and then make a HIGH to LOW transition on a rising edge of the clock signal CLK applied thereto when an even-numbered pulse of the converting start signal START makes a LOW to HIGH transition (see the waveform designated by (h) in FIG. 6). Similarly, the converting start controlling circuit 9 causes the second select signal S2 to make a LOW to HIGH transition on a rising edge of the clock signal CLK applied thereto when an even-numbered pulse of the converting start signal START makes a LOW to HIGH transition, and then make a HIGH to LOW transition on a rising edge of the clock signal CLK applied thereto when an odd-numbered pulse of the converting start signal START makes a LOW to HIGH transition (see the waveform designated by (i) in FIG. 6). Thus the first and second select signals S1 and S2 have two times as long as the periodicity of the converting start signal START, and they are 180° out of phase with each other.

The periodicity of the converting start signal START applied to the converting start controlling circuit 9 via the start signal input line 10 is shorter than the AD conversion period of time during which each of the first and second analog-to-digital converting units 8a and 8b performs the AD converting operation. To be more specific, the periodicity of the converting start signal START is one-half the AD conversion period of time.

In FIG. 1, reference numeral 11 denotes an output selecting circuit for alternately selecting an n-bit digital signal furnished by the first analog-to-digital conversion controlling circuit 6a or an n-bit digital signal furnished by the second analog-to-digital conversion controlling circuit 6b according to whether it receives the first or second select signal S1 or S2 from the converting start controlling circuit 9 so as to send out the selected digital signal as an output signal.

Figure 5:
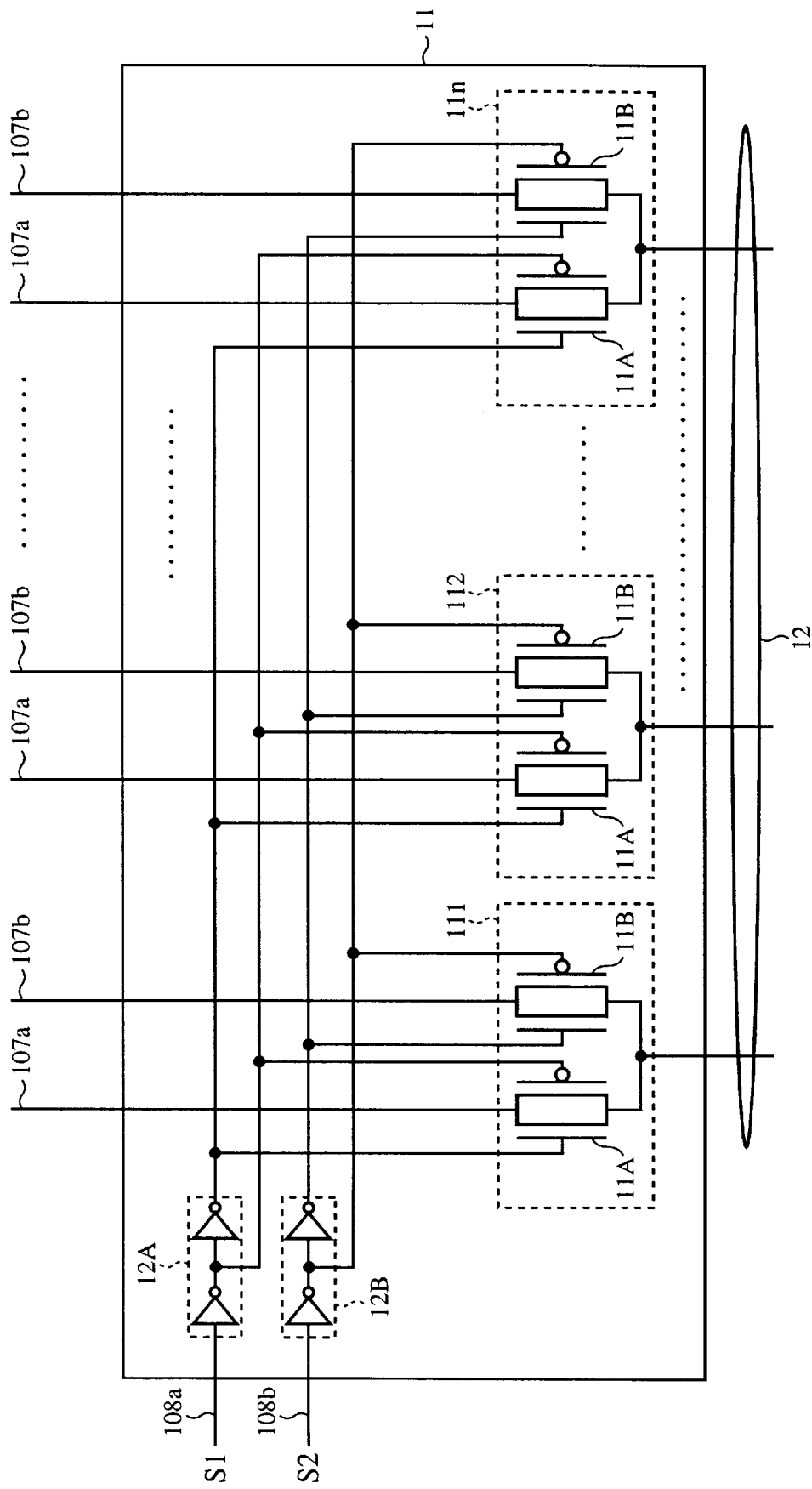
FIG. 5 is a circuit diagram showing the structure of an output selecting circuit of the analog-to-digital converting circuitry shown in FIG. 1.

Referring next to FIG. 5, there is illustrated a block diagram showing the structure of the output selecting circuit 11. In the figure, reference numerals 111 through 11n denote n selectors each of which is connected to each of n signal lines of the signal bus 107a, each of n signal lines of the signal bus 107b, and each of the n signal lines of the output bus 12. Each of the selectors 111 through 11n is provided with a first transmission gate 11A which is connected between a corresponding signal line of the signal bus 107a and a corresponding signal line of the output bus 12, and which switches between its ON and OFF states according to the value of the first select signal S1 applied thereto via the signal line 108a, and a second transmission gate 11B which is connected between a corresponding signal line of the signal bus 107b and a corresponding signal line of the output bus 12, and which switches between its ON and OFF states according to the value of the second select signal S2 applied thereto via the signal line 108b. The first transmission gate 11A is comprised of an N-channel MOS transistor and a P-channel MOS transistor connected in parallel to each other. Similarly, the second transmission gate 11B is comprised of an N-channel MOS transistor and a P-channel MOS transistor connected in parallel to each other.

Reference numeral 12A denotes a first buffer unit for applying the non-inverted first select signal S1 applied thereto via the signal line 108a to the gate electrode of the N-channel MOS transistor of the first transmission gate 11A of each of the plurality of selectors 111 through 11n, and for applying the inverse of the first select signal S1 to the gate electrode of the P-channel MOS transistor of the first transmission gate 11A of each of the plurality of selectors 111 through 11n. The first buffer unit 12A is comprised of a cascaded two-stage series of inverters. Furthermore, reference numeral 12B denotes a second buffer unit for applying the non-inverted second select signal S2 applied thereto via the signal line 108b to the gate electrode of the N-channel MOS transistor of the second transmission gate 11B of each of the plurality of selectors 111 through 11n, and for applying the inverse of the second select signal S2 to the gate electrode of the P-channel MOS transistor of the second transmission gate 11B of each of the plurality of selectors 111 through 11n. The second buffer unit 12B is comprised of a cascaded two-stage series of inverters.

Next, a description will be made as to the operation of the analog-to-digital converting circuitry of this embodiment which is so constructed as mentioned above with reference to FIGS. 6 and 7. For simplicity, the description is directed to the operation of an example of the analog-to-digital converting circuitry which can convert an analog signal into an 8-bit digital signal. In this case, the common reference voltage generating circuit 2 generates ($2^8-1$) reference voltages. Each of the first and second reference voltage selecting signals is an 8-bit parallel binary word. Each of the signal buses is constructed of eight signal lines. In addition, each of the first and second analog-to-digital conversion control circuits 6a and 6b is provided with eight latches, and the output selecting circuit 11 is provided with eight selectors.

When an odd-numbered pulse of the converting start signal START, as indicated by the waveform (c) in FIG. 6, which makes a LOW to HIGH transition is applied, by way of the start signal input line 10, to the converting start controlling circuit 9 at the time T1 shown in FIG. 6, and then the clock signal CLK, as indicated by the waveform (b) in FIG. 6, which makes a LOW to HIGH transition is applied, by way of the clock input line 7, to the converting start controlling circuit 9, the converting start controlling circuit 9 sends out the first converting start timing signal START1 which makes a LOW to HIGH transition on the rising edge of the clock signal CLK on the signal line 106a, as can be seen from the waveform (d) in FIG. 6.

When the first analog-to-digital converting unit 8a receives the first converting start timing signal START1 at a logic HIGH level from the converting start controlling circuit 9 by way of the signal line 106a, the first analog-to-digital converting unit 8a starts to perform the analog-to-digital conversion on the analog value at the time T1 of an input signal having a waveform as shown in (a) of FIG. 6 which is applied thereto via the input signal line 5. In the first analog-to-digital converting unit 8a, when the first converting start timing signal START1 makes a LOW to HIGH transition and then the clock signal CLK makes a LOW to HIGH transition, the timing signal generating unit 62 of the analog-to-digital conversion controlling circuit 6a sends out the first sample-and-hold control signal, which makes a LOW to HIGH transition at the time t1 on a rising edge of the clock signal CLK, as indicated by the waveform c) in FIG. 7, and, after two periods of the clock signal CLK, makes a HIGH to LOW transition, on the signal line 104a. In FIG. 7, the time t1 corresponds to the time T1 shown in FIG. 6.

When the sample-and-hold circuit 41 of the first bit signal generating circuit 4a receives the first sample-and-hold signal at a logic HIGH level, the sample-and-hold circuit 41 starts to sample the input signal applied thereto via the input signal line 5 and then hold an analog value sampled from the input signal. The sample-and-hold circuit 41 continues to hold the analog value until it receives the next pulse asserted HIGH of the first converting start timing signal START1.

The timing signal generating unit 62 of the first analog-to-digital conversion controlling circuit 6a sends out the first comparison control signal (see the waveform (d) in FIG. 7) asserted HIGH on the signal line 104 in response to the rising edge (at the time t2 in FIG. 7) of the third pulse of the clock signal CLK applied thereto since the corresponding sample-and-hold operation was started. In response to the rising edge of the first comparison control signal, the comparator 42 compares the value of an analog input signal being held in the sample-and-hold circuit 41 to the comparison voltage which has been generated by the common reference voltage generating circuit 2 and has been selected by the first reference voltage selecting circuit 3a, and then sends out a bit signal representing the comparison result on the signal line 105a.

The selecting signal generating unit 61 of the first bit signal generating circuit 4a sends out the first reference voltage selecting signal comprised of the voltage control signal #1 at a logic HIGH level which corresponds to the most significant bit of the 8-bit digital signal to be generated, and the other voltage control signals #2 to #8 at a logic LOW level on the signal bus 101a in response to the rising edge (at the time t2 in FIG. 7) of the third pulse of the clock signal CLK applied thereto since the corresponding sample-and-hold operation was started (see the waveforms (e1) through (e8) in FIG. 7). According to the first reference voltage selecting signal comprised of the plurality of voltage control signals at logic HIGH, logic LOW, logic LOW, logic LOW, logic LOW, logic LOW, logic LOW, and logic LOW levels, the first reference voltage selecting circuit 3a selects one reference voltage which corresponds to a digital binary word "10000000" from among the plurality of reference voltages generated by the common reference voltage generating circuit 2.

As a result, the comparator 42 compares the selected reference voltage, i.e., the comparison voltage which corresponds to the digital binary word "10000000" to the analog value of the input signal and then furnishes a bit signal representing the comparison result, which corresponds to the most significant bit of the 8-bit digital signal into which the analog input signal is to be converted. When the value of the analog input signal is greater than the value of the comparison voltage, the comparator furnishes a bit signal at a logic HIGH level representing a binary value "1". On the contrary, when the value of the analog input signal is smaller than or equal to the value of the comparison voltage, the comparator furnishes a bit signal at a logic LOW level representing a binary value "0".

The bit signal at a logic HIGH or LOW level from the comparator 42 is injected into the first analog-to-digital conversion controlling circuit 6a. The selecting signal generating unit 61 of the first analog-to-digital conversion controlling circuit 6a then and makes and keeps the value of the voltage control signal #1 equal to the value of the bit signal from the comparator 42 and continues to furnish the voltage control signal #1 until the first converting start timing signal START1 makes a LOW to HIGH transition again and then the selecting signal generating unit 61 of the first analog-to-digital conversion controlling circuit 6a is reset, as indicated by the waveform (e1) in FIG. 7.

The timing signal generating unit 62 of the first analog-to-digital conversion controlling circuit 6a sends out the first latch control signal constructed of a signal at a logic HIGH level which corresponds to the most significant bit of the 8-bit digital signal to be generated, and other signals at a logic LOW level which correspond to the other bits of the 8-bit digital signal on the signal bus 109 in response to the rising edge (at the time t2 in FIG. 7) of the third pulse of the clock signal CLK applied thereto since the corresponding sample-and-hold operation was started. When the memory unit 63 receives the first latch control signal comprised of the plurality of signals at logic HIGH, logic LOW, logic LOW, logic LOW, logic LOW, logic LOW, logic LOW, and logic LOW levels, the first D type flip-flop 63A of the latch 631 captures the value of the bit signal from the first bit signal generating unit 3a applied thereto via the signal line 105a in response to the rising edge of the most significant bit signal included in the first latch control signal, and holds the value of the bit signal from the first bit signal generating unit 3a until the first converting start timing signal START1 makes a LOW to HIGH transition again and then the first analog-to-digital conversion controlling circuit 6a is reset, as indicated by the waveform (g1) in FIG. 7.

Figure 8:
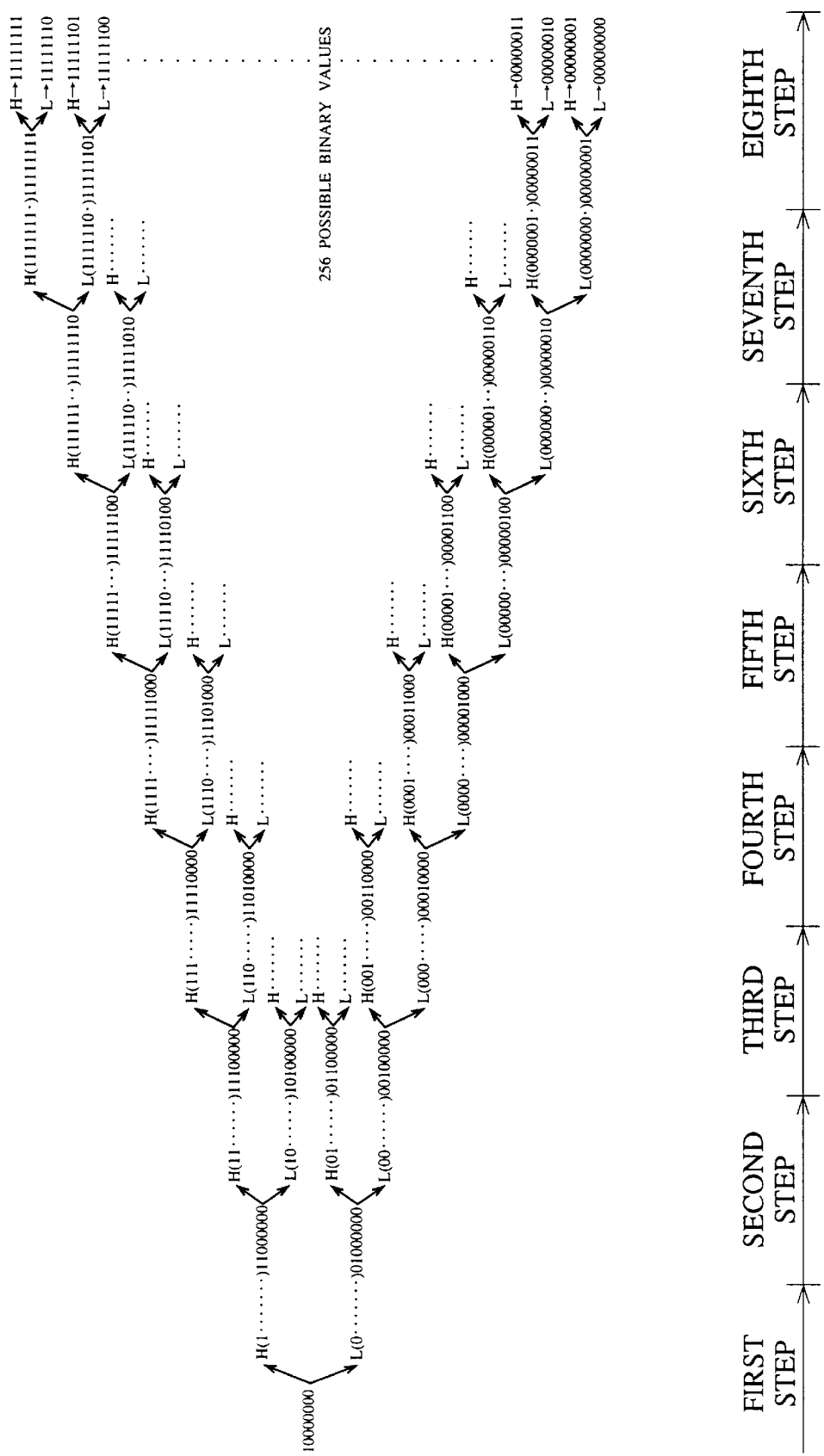
FIG. 8 is a view showing possible values of a reference voltage selecting signal generated by a selecting signal generating unit, a reference voltage from a common reference voltage generating circuit selected by a reference voltage selecting circuit, a bit signal from the bit signal generating circuit, and contents stored in a memory unit.

Referring next to FIG. 8, there is illustrated a view showing possible values of the first reference voltage selecting signal generated by the selecting signal generating unit 61, the reference voltage from the common reference voltage generating circuit 2 selected by the first reference voltage selecting circuit 3a, the bit signal from the comparator 42 of the first bit signal generating circuit 4a, and the contents stored in the D type flip-flops 63A of the first through eighth latches 631 through 638. In the first step shown in FIG. 8 wherein the bit-by-bit conversion operation is carried out for the most significant bit of the 8-bit digital signal to be generated, a binary data "10000000" shows the binary value of the first reference voltage selecting signal generated by the selecting signal generating unit 61 of the first bit signal generating circuit 4a, and the value of the reference voltage from the common reference voltage generating circuit 2 selected by the first reference voltage selecting circuit 3a. "H" and "L" show the possible values of the bit signal, which corresponds to the most significant bit of the 8-bit digital signal, from the comparator 42 of the first bit signal generating circuit 4a, and (1 - - -) and (0 - - -) show the possible contents stored in the D type flip-flops 63A of the first through eighth latches 631 through 638.

The value of the most significant bit of the 8-bit digital signal which corresponds to the analog value of the input signal sampled and held at the time t1 (i.e., T1) is thus obtained and is stored in the first latch 631 of the memory unit 63.

The selecting signal generating unit 61 of the first bit signal generating circuit 4a then sends out the first reference voltage selecting signal comprised of the first voltage control signal #1 at a logic HIGH or LOW level which corresponds to the most significant bit of the 8-bit digital signal, the second voltage control signal #2 at a logic HIGH level which corresponds to the second-highmost bit of the 8-bit digital signal, and the other voltage control signals #3 through #8 at a logic LOW level on the signal bus 101a in response to the rising edge, at the time t3 in FIG. 7, of the clock signal CLK applied thereto (see the waveforms (e1) through (e8) in FIG. 7). According to the first reference voltage selecting signal comprised of the plurality of voltage control signals at logic HIGH or LOW, logic HIGH, logic LOW, logic LOW, logic LOW, logic LOW, logic LOW, and logic LOW levels, the first reference voltage selecting circuit 3a selects one reference voltage which corresponds to a binary word "1 or 0,1,0,0,0,0,0,0" from among the plurality of reference voltages generated by the common reference voltage generating circuit 2.

As a result, the comparator 42 compares the selected reference voltage, i.e., the comparison voltage which corresponds to the binary word "1 or 0,1,0,0,0,0,0,0" to the analog value of the input signal and then furnishes a bit signal representing the comparison result which corresponds to the second-most significant bit of the 8-bit digital signal into which the analog input signal is to be converted. When the value of the analog input signal is greater than the value of the comparison voltage, the comparator 42 furnishes a bit signal at a logic HIGH level representing a binary value "1". On the contrary, when the value of the analog input signal is smaller than or equal to the value of the comparison voltage, the comparator 42 furnishes a bit signal at a logic LOW level representing a binary value "0".

The bit signal from the comparator 42 is injected into the first analog-to-digital conversion controlling circuit 6a. The selecting signal generating unit 61 of the first analog-to-digital conversion controlling circuit 6a then makes and keeps the value of the voltage control signal #2 equal to the value of the bit signal from the comparator 42 and then continues to furnish the voltage control signal #2 together with the voltage control signal #1 until the first converting start timing signal START1 makes a LOW to HIGH transition again and then the first analog-to-digital conversion controlling circuit 6a is reset, as indicated by the waveform (e2) in FIG. 7.

The timing signal generating unit 62 of the first analog-to-digital conversion controlling circuit 6a sends out the first latch control signal comprised of a signal at a logic HIGH level which corresponds to the second-most significant bit of the 8-bit digital signal, and other signals at a logic LOW level which correspond to the other bits of the 8-bit digital signal on the signal bus 109 in response to the rising edge of the clock signal CLK at the time t3 in FIG. 7. When the memory unit 63 receives the first latch control signal comprised of the plurality of signals at logic LOW, logic HIGH, logic LOW, logic LOW, logic LOW, logic LOW, logic LOW, and logic LOW levels, the first D type flip-flop 63A of the second latch 632 captures the value of the bit signal from the first bit signal generating unit 3a applied thereto via the signal line 105a in response to the rising edge of the second-most significant bit signal included in the first latch control signal, and holds the value of the bit signal until the first converting start timing signal START1 makes a LOW to HIGH transition again and then the first analog-to-digital conversion controlling circuit 6a is reset, as indicated by the waveform (g2) in FIG. 7.

The second step in FIG. 8 shows such the bit-by-bit conversion operation for the second-most significant bit of the 8-bit digital signal. In the second step, binary data "11000000" and "01000000" show the possible values of the first reference voltage selecting signal generated by the selecting signal generating unit 61 of the first bit signal generating circuit 4a, and the possible values of the reference voltage from the common reference voltage generating circuit 2 selected by the first reference voltage selecting circuit 3a. "H" and "L" show the possible values of the bit signal, which corresponds to the second-most significant bit of the 8-bit digital signal, from the comparator 42 of the first bit signal generating circuit 4a, and (11 - - -), (10 - - -), (01 - - -), and (00 - - -) show the possible contents stored in the D type flip-flops 63A of the first through eighth latches 631 through 638 of the memory unit 63.

The value of the second-most significant bit of the 8-bit digital signal which corresponds to the analog value of the input signal sampled and held at the time t1 (i.e., T1) is thus obtained and is stored in the second latch 632 of the memory unit 63.

After that, at the time t4, t5, t6, t7, t8, and t9, the bit-by-bit conversion operation is carried out for the other bits of the 8-bit digital signal which corresponds to the analog value of the input signal sampled and held at the time t1, like the bit-by-bit conversion for the most and second-most significant bits performed at the time t1 and t2. The third-most significant bit thorough the least significant bit of the 8-bit digital signal which corresponds to the analog value of the input signal sampled and held at the time t1 (i.e., T1) are thus determined and are then stored in the third through eighth latches 633 through 638, respectively.

That is, at the time t4, t5, t6, t7, t8, or t9, the selecting signal generating unit 61 of the bit signal generating circuit 4a sends out the first reference voltage selecting signal comprised of the first and second voltage control signals #1 and #2 at a logic HIGH or LOW level which corresponds to the most significant bit and secondmost significant bit, respectively, and the voltage control signals #3 through #8 which respectively correspond to the third-most significant bit through the least significant bit of the 8-bit digital signal, and only one of which is at a logic HIGH level, on the signal bus 101a in response to the rising edge of the clock signal CLK applied thereto (see the waveforms (e3) through (e8) in FIG. 7). According to the first reference voltage selecting signal comprised of the plurality of voltage control signals, the first reference voltage selecting circuit 3a selects one reference voltage from among the plurality of reference voltages generated by the common reference voltage generating circuit 2. As a result, the comparator 42 of the first bit signal generating circuit 4a compares the selected reference voltage, i.e., the comparison voltage to the analog value of the input signal and then furnishes a bit signal representing the comparison result, which corresponds to one of the third-most significant bit through the least significant bit of the 8-bit digital signal to be generated. The bit signal from the comparator 42 is then injected into the first analog-to-digital conversion controlling circuit 6a. The selecting signal generating unit 61 of the first analog-to-digital conversion controlling circuit 6a makes and keeps the value of a corresponding one of the voltage control signals #3 through #8 equal to the value of the bit signal, which corresponds to the third-most significant bit, fourth-most significant bit, . . . , or least significant bit of the 8-bit digital signal, from the comparator 42 until the first converting start timing signal START1 makes a LOW to HIGH transition again and then the first analog-to-digital conversion controlling circuit 6a is reset. Furthermore, the timing signal generating unit 62 of the first analog-to-digital conversion controlling circuit 6a sends out the first latch control signal comprised of a signal at a logic HIGH level which corresponds to one of the third-most significant bit through the least significant bit of the 8b it digital signal, and other signals at a logic LOW level which correspond to the other bits of the 8-bit digital signal on the signal bus 109 in response to the rising edge of the clock signal CLK at the time t4, t5, t6, t7, t8, or t9 in FIG. 7. When the memory unit 63 receives the first latch control signal, the first D type flip-flop 63A of a corresponding one of the third through eighth latches 633 through 638, which respectively correspond to the third-most significant bit through the least significant bit of the 8-bit digital signal, captures the value of the bit signal from the first bit signal generating unit 3a, and holds the value of the bit signal until the first converting start timing signal START1 makes a LOW to HIGH transition again and then the first analog-to-digital conversion controlling circuit 6a is reset, as indicated by the waveforms (g3 through g8) in FIG. 7.

The values of the third-most significant bit through the least significant bit of the 8-bit digital signal which corresponds to the analog value of the input signal sampled and held at the time t1 (i.e., T1) are thus obtained sequentially and are stored in the third through eighth latches 633 through 638 of the memory unit 63, respectively (see third through eighth steps shown in FIG. 8). Accordingly, all the bits of the 8-bit digital signal which corresponds to the analog value of the input signal sampled and held at the time t1 (i.e., T1) are stored in the first through eighth latches 631 through 638 of the memory unit 63, respectively.

The timing signal generating unit 62 of the first analog-to-digital conversion controlling circuit 6a sends out the second latch control signal which is asserted HIGH within a predetermined period of time on the signal line 110 in response to the falling edge of the clock signal CLK applied thereto just after the time t9. In response to the rising edge of the second latch control signal, the second D type flip-flops 63B of the first through eighth latches 631 through 638 of the memory unit 63 receive the bit signals from the Q output terminals of the first D flip flops 63A of the first through eighth latches 631 through 638, respectively. After the time t9, the second D type flip-flops 63B hold the values of the bit signals until the clock signal CLK makes a HIGH to LOW transition (see the waveforms (g1 through g8) in FIG. 7).

The 8-bit digital signal, the binary value of which is held in the second D type flip-flops 63B of the first through eighth latches 631 through 638 of the memory unit 63 of the first analog-to-digital conversion controlling circuit 6a, is applied to the output selecting circuit 11 by way of the signal line 107a. In the output selecting circuit 11, the transmission gates 11A of the n selectors 111 through 11n are brought into conduction on the rising edge of the first select signal S1 at the time T3 shown in FIG. 6 (see the waveform (h) in FIG. 6), and therefore the 8-bit digital signal (D11) furnished, by way of the signal line 107a, thereto by the memory unit 63 of the first analog-to-digital conversion controlling circuit 6a is sent out on the output line 12 (see the waveform (j) in FIG. 6). At that time, the second transmission gates 11B of the n selectors 111 through 11n of the output selecting circuit 11 are brought out of conduction since the second selecting signal S1 from the converting start controlling circuit 9 makes a HIGH to LOW transition.

In FIG. 7, the period of time from the time t1 to the time t2 (i.e., two periods of the clock signal CLK) is the sample-and-hold period of time during which the first analog-to-digital converting unit 8a samples and holds a value of the analog input signal, the period of time from the time 2 to the time t11 (i.e., eight periods of the clock signal CLK) is the bit-by-bit conversion period of time during which the first analog-to-digital converting unit 8a carries out the AD conversion operation on the sampled and held value of the analog input signal bit-by-bit, and the period of time from the time t1 to the time t11 (i.e., 10 periods of the clock signal CLK) is the AD conversion period of time during which the first analog-to-digital converting unit 8a carries out the AD conversion operation. The period of time from the time t1 to the time t10 corresponds to the period of time TA from the time T1 to the time T3 shown in FIG. 6.

On the other hand, when an even-numbered pulse of the converting start signal START makes a LOW to HIGH transition at the time T2, as indicated by the waveform (c) in FIG. 6, and the clock signal CLK makes a LOW to HIGH transition, as indicated by the waveform (b) in FIG. 6, the converting start controlling circuit 9 causes the second converting start timing signal START 2 to make a LOW to HIGH transition and then sends out it in response to the rising edge of the clock signal CLK on the signal line 106b.

When the second analog-to-digital converting unit 8b receives the second converting start timing signal START2 asserted HIGH from the converting start controlling circuit 9 by way of the signal line 106b, the second analog-to-digital converting unit 8b starts to perform an AD conversion operation on an analog value of the input signal as shown by the waveform (a) in FIG. 6 applied thereto via the input signal line 5 at the time T2. Like the first analog-to-digital converting unit 8a, the second analog-to-digital converting unit 8b samples and holds the value of the analog input signal at the time T2 and then performs the AD conversion operation on the value sampled and held of the analog input signal bit-by-bit in accordance with the same timing chart as that from the time t1 to the time t11 shown in FIG. 7. The second analog-to-digital converting unit 8b can thus determine the most significant bit through the least significant bit of the 8b it digital signal which correspond to the value of the analog input signal sampled and held at the time T2, like the first analog-to-digital converting unit 8a. The second analog-to-digital converting unit 8b then stores the binary value of the digital signal in the first through eighth latches 631 through 638 of the memory unit 63 of the second analog-to-digital conversion controlling unit 6b.

The 8-bit digital signal, the binary value of which is held in the second D type flip-flops 63B of the first through eighth latches 631 through 638 of the memory unit 63 of the second analog-to-digital conversion controlling circuit 6b, is applied to the output selecting circuit 11 by way of the signal line 107b. In the output selecting circuit 11, the second transmission gates 11B of the n selectors 111 through 11n are brought into conduction on the rising edge of the second select signal S2 from the converting start controlling circuit 9 at the time T4 shown in FIG. 6 (see the waveform (i) in FIG. 6), and therefore the n-bit digital signal (D21) furnished, by way of the signal line 107b, thereto by the memory unit 63 of the second analog-to-digital conversion controlling circuit 6b is sent out on the output line 12 (see the waveform (j) in FIG. 6). At that time, the first transmission gates 11A of the n selectors 111 through 11n of the output selecting circuit 11 are brought out of conduction since the first selecting signal S1 from the converting start controlling circuit 9 makes a HIGH to LOW transition. The period of time TB from the time T2 to the time T4 shown in FIG. 6 is the period of time during which the second analog-to-digital converting unit 8b performs the AD conversion operation.

In the analog-to-digital converting circuit of this embodiment which is so constructed, the first analog-to-digital converting unit 8a samples and holds a value of an analog input signal in response to an odd-numbered pulse of the converting start signal START and then analog-to-digital converts the analog value into an n-bit digital signal, and the second analog-to-digital converting unit 8b samples and holds a value of the analog input signal in response to an even-numbered pulse of the converting start signal START and then analog-to-digital converts the analog value into an n-bit digital signal. Accordingly, the analog-to-digital converting circuit of this embodiment can sample and hold the analog input signal and send out a corresponding n-bit digital signal at intervals of time which are half the interval (i.e., the period of time) TA or TB during which the first or second analog-to-digital converting unit 8a or 8b performs the AD conversion operation.

As previously mentioned, the analog-to-digital converting circuit of the first embodiment of the present invention is provided with the reference voltage generating circuit for generating a reference voltage in common use for both the first and second analog-to-digital converting units 8a and 8b while taking the full advantage of the characteristics of a successive approximation analog-to-digital converter having a simple circuit structure. Accordingly, the first embodiment offers an advantage of speeding up the analog-to-digital conversion operation while preventing an increase in the size of the analog-to-digital conversion circuitry to the utmost.

Second Embodiment

Figure 9:
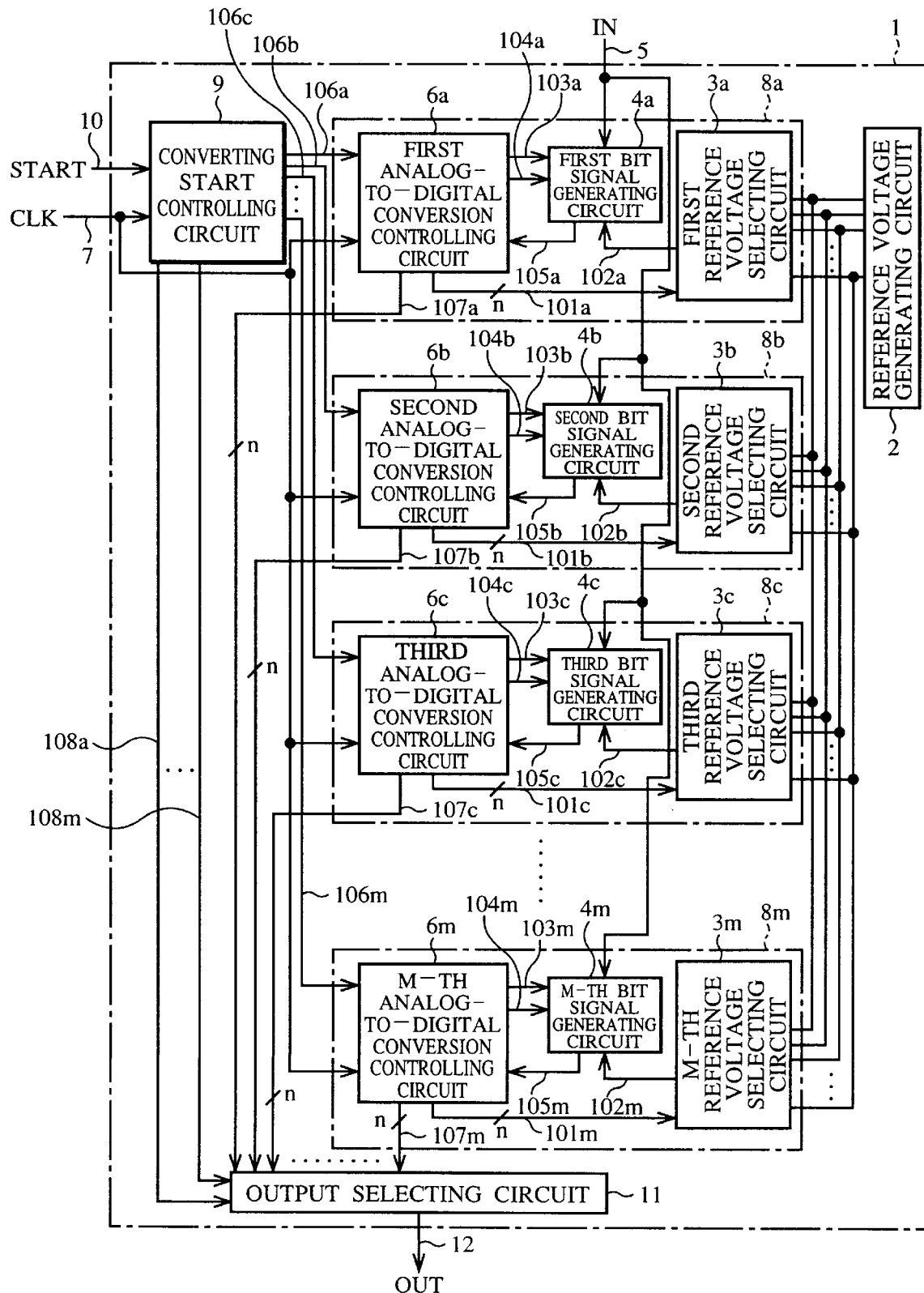
FIG. 9 is a block diagram of analog-to-digital converting circuitry according to a second embodiment of the present invention.

Referring next to FIG. 9, there is illustrated a block diagram showing the structure of analog-to-digital converting circuitry according to a second embodiment of the present invention. The analog-to-digital converting circuitry according to the second embodiment has the structure similar to that of the above-mentioned first embodiment, with the exception that the analog-to-digital converting circuitry of the second embodiment is provided with m (m is greater than or equal to 3) analog-to-digital converting units 8a, 8b, 8c, . . . , and 8m each including a reference voltage selecting circuit, a bit signal generating circuit, and an analog-to-digital conversion controlling circuit.

Figure 10:
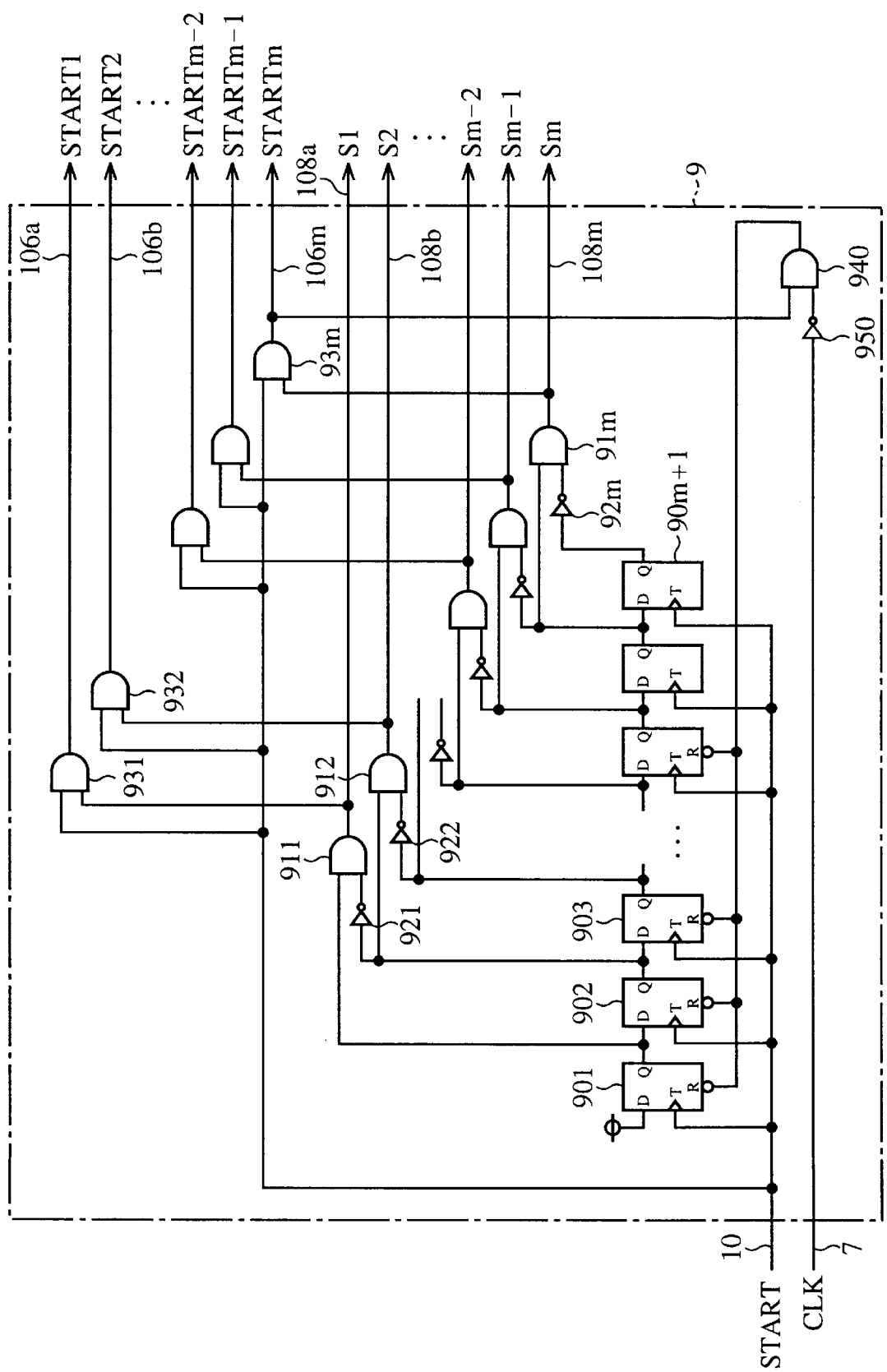
FIG. 10 is a circuit diagram showing the structure of a converting start controlling circuit of the analog-to-digital converting circuitry shown in FIG. 9.

Since the analog-to-digital converting circuitry of the second embodiment is provided with three or more analog-to-digital converting units 8a, 8b, 8c, . . . , and 8m, the converting start controlling circuit 9 and output selecting circuit 11 differs in a minimal way from those of the first embodiment mentioned above. Referring next to FIG. 10, there is illustrated a block diagram showing the structure of the converting start controlling circuit 9 of the second embodiment. In the figure, reference numerals 901, 902, . . . , and 90(m+1) each denotes one D type flip-flop included in a cascaded (m+1)-stage series of D type flip-flops. The D type flip-flop 901 at the first stage has its input terminal D connected to a node with a power supply potential, and its clock input terminal T connected to the signal line 10 via which the converting start signal START is applied thereto. The D type flip-flop 902, or 90(m+1) at the second or later stage has its input terminal D connected to the output terminal Q of the D type flip-flop 901, . . . , or 90m at the previous stage, and its clock input terminal T connected to the signal line 10 via which the converting start signal START is applied thereto. Reference numeral 911 denotes a first select signal logic circuit comprised of a two-input AND gate having its output terminal connected to the signal line 108a via which the converting start control circuit 9 furnishes a first select signal S1, 912 denotes a second select signal logic circuit comprised of a two-input AND gate having its output terminal connected to the signal line 108b via which the converting start control circuit 9 furnishes a second select signal S2, . . . , and 91m denotes an mth select signal logic circuit comprised of a two-input AND gate having its output terminal connected to the signal line 108m via which the converting start control circuit 9 furnishes an mth select signal Sm. The kth ($1 \leq k \leq m$) select signal logic circuit 91k has its first input terminal connected to the output terminal Q of the D type flip-flop 90k at the kth stage, and its second input terminal connected to the output terminal Q of the D type flip-flop 90(k+1) at the (k+1)-th stage by way of an inverter 92k.

Furthermore, reference numeral 931 denotes a first converting start signal logic circuit comprised of a two-input AND gate having its output terminal connected to the signal line 106a via which the converting start control circuit 9 furnishes the first converting start timing signal START1, 932 denotes a second select signal logic circuit comprised of a two-input AND gate having its output terminal connected to the signal line 106b via which the converting start control circuit 9 furnishes the second converting start timing signal START2, . . . , and 93m denotes an mth select signal logic circuit comprised of a two-input AND gate having its output terminal connected to the signal line 106m via which the converting start control circuit 9 furnishes an mth converting start timing signal STARTm. The kth ($1 \leq k < m$) converting start signal logic circuit 93k has its first input terminal connected to the start signal input line 10, and its second input terminal connected to the output terminal of the kth select signal logic circuit 91k. Furthermore, reference numeral 940 denotes a reset logic circuit comprised of a two-input AND gate having its first input terminal connected to the output terminal of the second converting start signal logic circuit 932, its second input terminal to which th clock signal CLK is applied via an inverter 950, and its output terminal connected to the reset terminal of the D type flip-flop 901 at the first stage.

Figure 12:
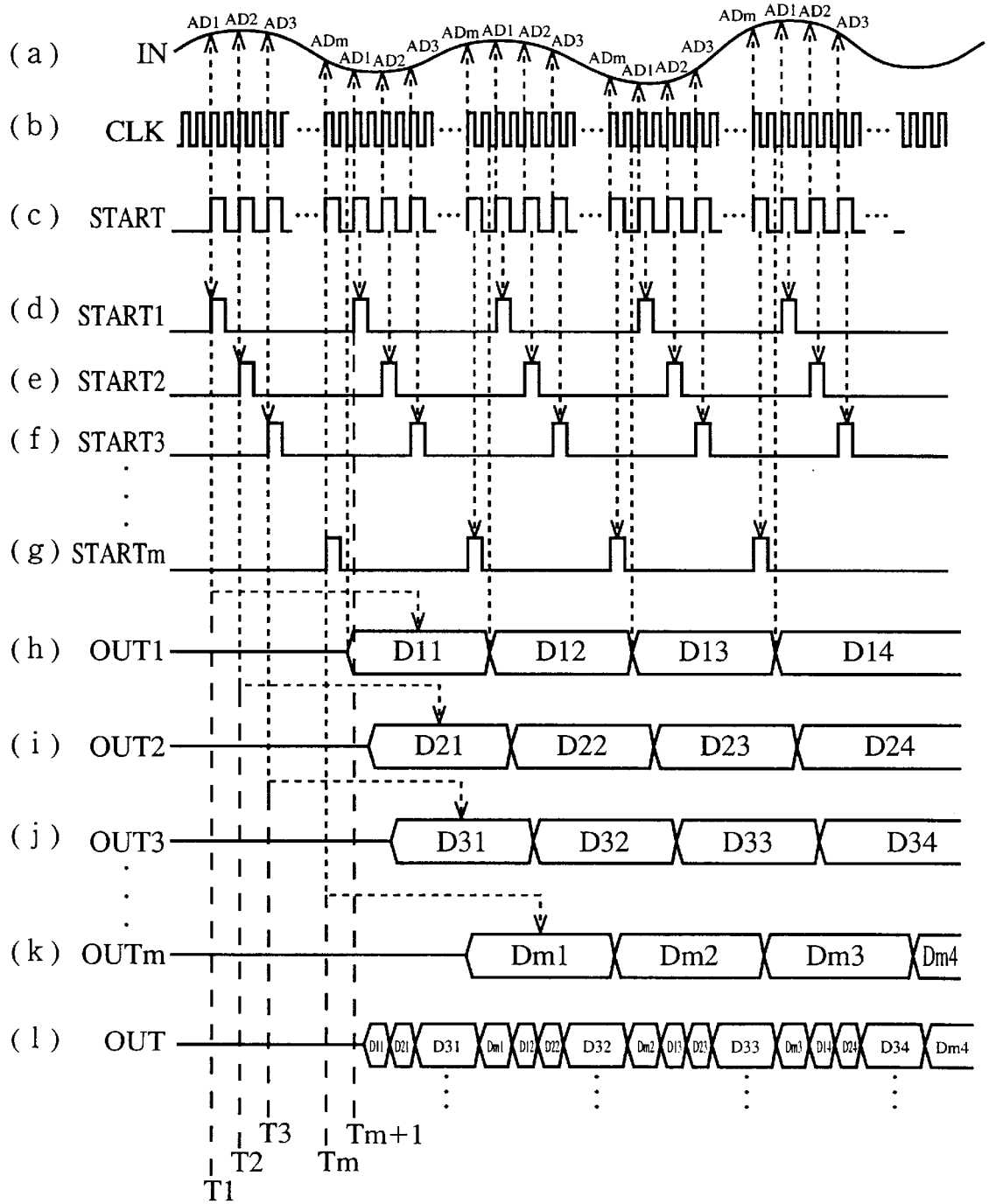
FIG. 12 is a timing diagram showing the operation timing with which the analog-to-digital converting circuitry according to the second embodiment of the present invention performs the analog-to-digital conversion operation.

The converting start controlling circuit 9 which is so constructed sends out the first through mth converting start timing signals START1 through STARTm which have m times as long as the periodicity of the converting start signal START, and which are (360/m)° out of phase with each other (see the waveforms (d) through (g) in FIG. 12). Furthermore, the converting start controlling circuit 9 sends out the first through mth select signals S1 through Sm which have m times as long as the periodicity of the converting start signal START, and which are (360/m)° out of phase with each other.

Figure 11:
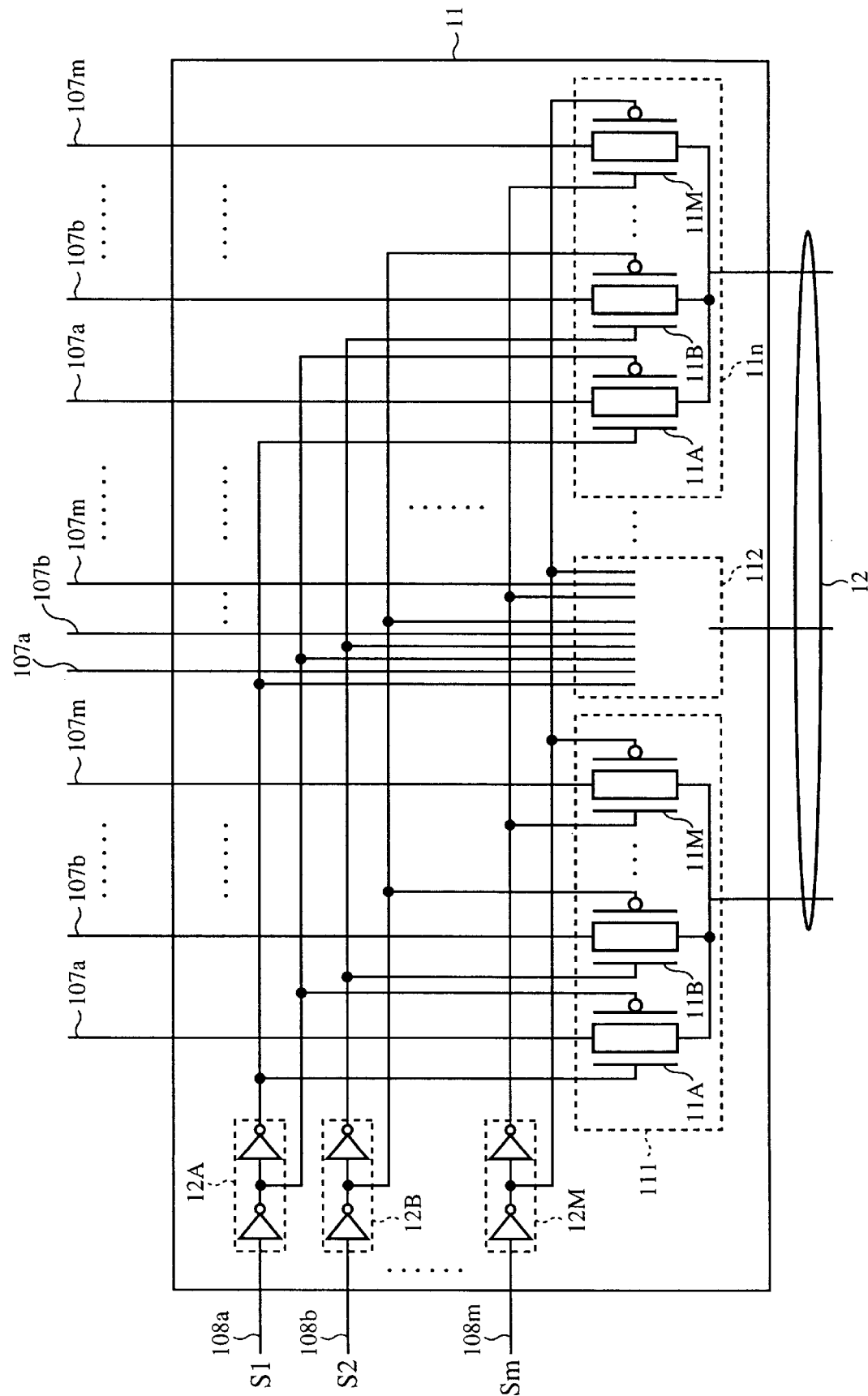
FIG. 11 is a circuit diagram showing the structure of an output selecting circuit of the analog-to-digital converting circuitry shown in FIG. 9.

Referring next to FIG. 11, there is illustrated a block diagram showing the structure of the output selecting circuit 11 of this embodiment. In the figure, reference numerals 111 through 11n denote selectors each of which is respectively connected to each of the n signal lines of the signal bus 107a, each of the n signal lines of the signal bus 107b, . . . , and each of the n signal lines of the signal bus 107m, and each of the n signal lines of the output bus 12. Each of the selectors 111 through 11n is provided with a first transmission gate 11A which is connected between a corresponding signal line of the signal bus 107a and a corresponding signal line of the output bus 12, and which switches between its ON and OFF states according to the value of the first select signal S1 applied thereto via the signal line 108a, a second transmission gate 11B which is connected between a corresponding signal line of the signal bus 107b and a corresponding signal line of the output bus 12, and which switches between its ON and OFF states according to the value of the second select signal S2 applied thereto via the signal line 108b, . . . , and an mth transmission gate 11M which is connected between a corresponding signal line of the signal bus 107m and a corresponding signal line of the output bus 12, and which switches between its ON and OFF states according to the value of the mth select signal Sm applied thereto via the signal line 108m. Each of the first through mth transmission gates 11A through 11M is comprised of an N-channel MOS transistor and a P-channel MOS transistor connected in parallel to each other.

Reference numeral 12A denotes a first buffer unit for applying the no-inverted first select signal S1 applied thereto via the signal line 108a to the gate electrode of the N-channel MOS transistor of the first transmission gate 11A of each of the plurality of selectors 111 through 11n, and for applying the inverse of the first select signal S1 to the gate electrode of the P-channel MOS transistor of the first transmission gate 11A of each of the plurality of selectors 111 through 11n. The first buffer unit 12A is comprised of two-stage inverters connected in series to each other. Furthermore, reference numeral 12B denotes a second buffer unit for applying the non-inverted second select signal S2 applied thereto via the signal line 108b to the gate electrode of the N-channel MOS transistor of the second transmission gate 11B of each of the plurality of selectors 111 through 11n, and for applying the inverse of the second select signal S2 to the gate electrode of the P-channel MOS transistor of the second transmission gate 11B of each of the plurality of selectors 111 through 11n. The second buffer unit 12B is comprised of two-stage inverters connected in series to each other. Similarly, reference numeral 12M denotes an mth buffer unit for applying the non-inverted mth select signal Sm applied thereto via the signal line 108m to the gate electrode of the N-channel MOS transistor of the mth transmission gate 11M of each of the plurality of selectors 111 through 11n, and for applying the inverse of the mth select signal Sm to the gate electrode of the P-channel MOS transistor of the mth transmission gate 11M of each of the plurality of selectors 111 through 11n. The mth buffer unit 12M is comprised of two-stage inverters connected in series to each other.

Next, a description will be made as to the operation of the analog-to-digital converting circuitry of the second embodiment of the present invention which is so constructed as mentioned above. For simplicity, the description is directed to the operation of the analog-to-digital converting circuitry which can convert an analog signal into an 8-bit digital signal.

When each of the first through mth analog-to-digital converting units 8a through 8m receives the corresponding converting start timing signal START1, or STARTm at a logic HIGH level from the converting start controlling circuit 9, each of the first through mth analog-to-digital converting units 8a through 8m starts to perform the analog-to-digital conversion on an analog value of an input signal applied thereto bit-by-bit in accordance with the same timing chart as that from the time t1 to the time t11 shown in FIG. 7, like the first and second analog-to-digital converting units 8a and 8b of the first embodiment mentioned above.

The first analog-to-digital converting unit 8a samples and holds a value of the analog input signal at the time T1 shown in FIG. 12, and then sends out an n-bit digital signal having a value which corresponds to the analog value on the signal line 106a on the falling edge of the clock signal CLK applied thereto just before the time Tm+1 (see the waveform (h) in FIG. 12). On the other hand, the second analog-to-digital converting unit 8b samples and holds a value of the analog input signal at the time T2 shown in FIG. 12, and then sends out an n-bit digital signal having a value which corresponds to the analog value on the signal line 106b on the falling edge of the clock signal CLK applied thereto just before the time Tm+2 (see the waveform (i) in FIG. 12). That is, the plurality of analog-to-digital converting units 8a through 8m respectively and sequentially sample and hold values of the analog input signal at the time T1, T2, . . . , and Tm which are shifted from each other in time by the length of time equal to one-mth (1/m) of the AD conversion period of time during which each analog-to-digital converting unit performs an AD conversion operation, and then analog-to-digital convert the analog values bit-by-bit, respectively and sequentially. The output selecting circuit 11 selects one from among the n-bit digital signals furnished by the plurality of analog-to-digital converting units 8a through 8m according to whether the output selecting circuit 11 receives the first select signal S1, second select signal S2, . . . , or mth select signal Sm, and then sends out the selected n-bit digital signal (see the waveform (1) in FIG. 12).

As previously mentioned, the analog-to-digital converting circuitry of this embodiment can sample and hold an analog input signal at predetermined intervals of time having the length of time equal to (1/m) of the period of time during which each of the plurality of analog-to-digital converting units 8a through 8m performs an AD conversion operation, and then successively analog-to-digital convert the input signal into a digital signal bit-by-bit and send out the digital signal. Accordingly, the second embodiment of the present invention offers an advantage of further speeding up the AD conversion operation of the AD converting circuitry as compared to the first embodiment.

The maximum value of the number of the first through mth analog-to-digital converting units 8a through 8m, i.e., the maximum value of m is equal to the number of pulses of the clock signal CLK applied to the analog-to-digital converting circuitry within a period of time during which each of the analog-to-digital converting units 8a through 8m performs an AD conversion operation. For example, in the case where the analog-to-digital converting circuitry of the present invention is adapted to generate an 8-bit digital signal, the maximum value of m is 10.

Many widely different embodiments of the present invention may be constructed without departing from the spirit and scope of the present invention. It should be understood that the present invention is not limited to the specific embodiments described in the specification, except as defined in the appended claims.

What is claimed is:

1. Analog-to-digital converting circuitry converting an analog input signal into an n-bit digital signal, n being an integer larger than 1, said circuitry comprising:

common reference voltage generating means for generating $2^n-1$ reference voltages;

a plurality of reference voltage selecting means, each reference voltage selecting means for selecting a reference voltage from the $2^n-1$ reference voltages generated by said common reference voltage generating means according to a corresponding reference voltage selecting signal and for furnishing a selected reference voltage as a comparison voltage;

a plurality of bit signal generating means, each bit signal generating means for sampling and holding an analog input signal in response to a corresponding sample-and-hold control signal, and for comparing an analog input signal being held to the comparison voltage from a corresponding reference voltage selecting means in response to a corresponding comparison control signal and furnishing a bit signal representing the comparison result in order to determine the value of one bit of an n-bit digital signal that represents the analog value;

a plurality of analog-to-digital conversion controlling means, each analog-to-digital conversion means furnishing the sample-and-hold control signal and the comparison control signal to a corresponding bit signal generating means in synchronization with a clock signal, for receiving and holding the bit signal from a corresponding one of said plurality of bit signal generating means, and for, when determining the value of a most significant bit of the n-bit digital signal, furnishing the reference voltage selecting signal having a predetermined value, and, otherwise, furnishing the reference voltage selecting signal having a value which depends on values of bit signals already received, to a corresponding reference voltage selecting means in synchronization with the clock signal, each of said plurality of analog-to-digital conversion controlling means furnishing all bit signals of the n-bit digital signal upon completion of determining values of all bits of the n-bit digital signal; and control means, responsive to a converting start signal from outside said analog-to-digital converting circuitry, for successively activating said plurality of analog-to-digital conversion controlling means and for successively sending out n-bit digital signals furnished by said plurality of analog-to-digital conversion controlling means.

2. The analog-to-digital converting circuitry according to claim 1, wherein said control means includes converting start controlling means, responsive to the converting start signal, for successively generating and furnishing a plurality of converting start timing signals having a longer period than a period of the converting start signal and being out of phase with each other, to said plurality of analog-to-digital conversion controlling means, respectively, and for successively generating and furnishing a plurality of select signals having a longer period than the period of the converting start signal, and being out of phase with each other; and output selecting means, responsive to each of the plurality of select signals, for selecting the digital signal furnished by a corresponding one of said plurality of analog-to-digital conversion controlling means and furnishing a selected digital signal as an output signal.

3. The analog-to-digital converting circuitry according to claim 1, wherein when the number of said plurality of analog-to-digital conversion controlling means is m, m being at least 2, the period of the plurality of converting start timing signals is (1/m) of the period of the converting start signal, and the plurality of converting start timing signals are $(360/m)°$ out of phase with each other.

4. Analog-to-digital converting circuitry converting an analog input signal into an n-bit digital signal, n being an integer larger than 1, said circuitry comprising:

common reference voltage generating means for generating $2^n-1$ reference voltages;

first reference voltage selecting means for selecting a reference voltage from among the $2^n-1$ reference voltages generated by said common reference voltage generating means according to a first reference voltage selecting signal and for furnishing a selected reference voltage as a comparison voltage;

first bit signal generating means for sampling and holding a value of an analog input signal in response to a first sample-and-hold control signal, and for comparing the analog value held to the comparison voltage from said first reference voltage selecting means in response to a first comparison control signal and then furnishing a bit signal representing the comparison result in order to determine the value of one bit of an n-bit digital signal that represents the analog value;

first analog-to-digital conversion controlling means for furnishing the first sample-and-hold control signal and the first comparison control signal to said first bit signal generating means in synchronization with a clock signal, for receiving and holding the bit signal from said first bit signal generating means, and for, when determining a value of a most significant bit of the n-bit digital signal, furnishing the first reference voltage selecting signal having a predetermined value, and, otherwise, furnishing the first reference voltage selecting signal having a value which depends on the values of bit signals already received, to said first reference voltage selecting means in synchronization with the clock signal, said first analog-to-digital conversion controlling means furnishing all bit signals of the n-bit digital signal upon completion of determining the values of all bits of the n-bit digital signal;

second reference voltage selecting means for selecting one reference voltage of the $2^n-1$ reference voltages generated by said common reference voltage generating means according to a second reference voltage selecting signal and for furnishing the selected reference voltage as a comparison voltage;

second bit signal generating means for sampling and holding a value of an analog input signal in response to a second sample-and-hold control signal and for comparing an analog value held to the comparison voltage from said second reference voltage selecting means in response to a second comparison control signal and then furnishing a bit signal representing the comparison result in order to determine a value of one bit of an n-bit digital signal that represents the analog value;

second analog-to-digital conversion controlling means for furnishing the second sample-and-hold control signal and second comparison control signal to said second bit signal generating means in synchronization with the clock signal, for receiving and holding the bit signal from said second bit signal generating means, and for, when determining a value of a most significant bit of the n-bit digital signal, furnishing the second reference voltage selecting signal having a predetermined value, and, otherwise, furnishing the second reference voltage selecting signal having a value which depends on the values of bit signals already received, to said second reference voltage selecting means in synchronization with the clock signal, said second analog-to-digital conversion controlling means furnishing all the bit signals as the n-bit digital signal when finishing determining the values of all bits of the n-bit digital signal; and control means, responsive to a converting start signal from outside said analog-to-digital converting circuitry, for activating said first or second analog-to-digital conversion controlling means alternatingly and for sending out the digital signals furnished by said first and second analog-to-digital conversion controlling means alternatingly.

5. The analog-to-digital converting circuitry according to claim 4, wherein said control means includes a converting start controlling means, responsive to the converting start signal, for successively generating and furnishing first and second converting start timing signals having a longer period than a period of the converting start signal, and being out of phase with each other, to said first and second analog-to-digital conversion controlling means, respectively, and for successively generating and furnishing first and second select signals having a longer period than the period of the converting start signal, and which are out of phase with each other; and output selecting means, responsive to each of the first and second select signals, for selecting the digital signal furnished by a corresponding one of said first and second analog-to-digital conversion controlling means, and furnishing the selected digital signal as an output signal.

6. The analog-to-digital converting circuitry according to claim 5, wherein the period of the first and second converting start timing signals is one-half of the period of the converting start signal, and the first and second converting start timing signals are one-hundred eighty degrees out of phase with each other.

* * * * *